(12) United States Patent
Suzuki et al.

(10) Patent No.: US 11,496,152 B2
(45) Date of Patent: Nov. 8, 2022

(54) DECODING DEVICE, DECODING METHOD, AND PROGRAM

(71) Applicant: Sony Corporation, Tokyo (JP)

(72) Inventors: Shiro Suzuki, Kanagawa (JP); Shuichiro Nishigori, Tokyo (JP); Hirofumi Takeda, Kanagawa (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 17/265,171

(22) PCT Filed: Jun. 5, 2019

(86) PCT No.: PCT/JP2019/022345
§ 371 (c)(1),
(2) Date: Feb. 1, 2021

(87) PCT Pub. No.: WO2020/031483
PCT Pub. Date: Feb. 13, 2020

(65) Prior Publication Data
US 2021/0359703 A1 Nov. 18, 2021

(30) Foreign Application Priority Data
Aug. 8, 2018 (JP) .............................. JP2018-149514

(51) Int. Cl.
*H03M 7/34* (2006.01)
*H03M 7/30* (2006.01)
(Continued)

(52) U.S. Cl.
CPC ............ *H03M 7/6005* (2013.01); *H03M 7/70* (2013.01); *G06F 3/016* (2013.01); *H03M 7/40* (2013.01)

(58) Field of Classification Search
CPC ........ H03M 7/6005; H03M 7/70; H03M 7/40; H03M 7/00; G06F 3/016
(Continued)

(56) References Cited

U.S. PATENT DOCUMENTS 7,246,065 B2 * 7/2007 Tanaka ................... H04N 19/63
704/500
9,264,094 B2 * 2/2016 Daimou .................. G10L 19/24
(Continued)

FOREIGN PATENT DOCUMENTS

EP 1612772 A1 1/2006
EP 1715476 A1 10/2006
(Continued)

OTHER PUBLICATIONS

Hahabi C et al:"A comparison of different haptic compression techniques",Proceedings / 2002 IEEE International Conference on Multimedia and Expo : Aug. 26-29, 2002, Swiss Federal Institute of Technology, Lausanne, Switzerland, IEEE Operations Center, Piscataway, NJ, vol. 1, Aug. 26, 2002 (Aug. 26, 2002), pp. 657-660, XP010604454,ISBN: 978-0-7803-7304-4.
(Continued)

*Primary Examiner* — Jean B Jeanglaude
(74) *Attorney, Agent, or Firm* — Wolf, Greenfield & Sacks, P.C.

(57) ABSTRACT

A decoding device comprising a decoding unit configured to decode a tactile signal encoded for each of frequency bands. A decoding method comprising decoding a tactile signal encoded for each of frequency bands. A non-transitory storage medium encoded with instructions that, when executed by a computer, execute processing comprising decoding a tactile signal encoded for each of frequency bands.

13 Claims, 24 Drawing Sheets

(51) Int. Cl.
*G06F 3/01* (2006.01)
*H03M 7/40* (2006.01)

(58) Field of Classification Search
USPC .................................................. 341/50, 51
See application file for complete search history.

(56) References Cited

U.S. PATENT DOCUMENTS

| | | | |
|---|---|---|---|
| 10,410,647 B2* | 9/2019 | Kikuiri | G10L 19/12 |
| 2003/0142746 A1* | 7/2003 | Tanaka | H04N 19/63 |
| | | | 375/240.11 |
| 2006/0004566 A1 | 1/2006 | Oh et al. | |
| 2006/0074693 A1 | 4/2006 | Yamashita | |
| 2014/0122065 A1* | 5/2014 | Daimou | H04B 1/667 |
| | | | 704/205 |
| 2014/0168110 A1 | 6/2014 | Araki et al. | |
| 2017/0117000 A1* | 4/2017 | Kikuiri | G10L 19/028 |
| 2017/0354870 A1 | 12/2017 | Okamura | |
| 2019/0355371 A1* | 11/2019 | Kikuiri | G10L 19/032 |
| 2021/0266010 A1* | 8/2021 | Nishigori | H03M 7/70 |

FOREIGN PATENT DOCUMENTS

| | | |
|---|---|---|
| EP | 1715477 A1 | 10/2006 |
| EP | 3254739 A1 | 12/2017 |
| JP | H09-90867 A | 4/1997 |
| JP | 2006-011456 A | 1/2006 |
| JP | 2006-279272 A | 10/2006 |
| JP | 2017-221631 A | 12/2017 |
| WO | WO 2005/004113 A1 | 1/2005 |
| WO | WO 2014/097499 A1 | 6/2014 |

OTHER PUBLICATIONS

Hiroyuki Tanaka et al:"Haptic data compression/decompression using OCT for motion copy system" Proc. IEEE International Conference on Mechatronics 2009 (ICM 2009). IEEE, Piscataway, NJ, USA, Apr. 14, 2009 (Apr. 14, 2009), pp. 1-6, XP031457235, DOI: 10 .1109/ I CME CH. 2009. 4957156 ISBN: 978-1-4244-4194-5.
International Search Report and English translation thereof dated Jul. 23, 2019 in connection with International Application No. PCT/JP2019/022345.

* cited by examiner

DECODING DEVICE, DECODING METHOD, AND PROGRAM

CROSS-REFERENCE TO RELATED APPLICATIONS

This is a U.S. National Stage Application under 35 U.S.C. § 371, based on International Application No. PCT/JP2019/022345, filed in the Japanese Patent Office as a Receiving Office on Jun. 5, 2019, entitled "DECODING DEVICE, DECODING METHOD, AND PROGRAM," which claims priority under 35 U.S.C. § 119(a)-(d) or 35 U.S.C. § 365(b) to Japanese Patent Application Number JP2018-149514, filed in the Japanese Patent Office on Aug. 8, 2018, each of which applications is hereby incorporated by reference in its entirety.

TECHNICAL FIELD

The present technology relates to a decoding device for decoding an encoded tactile signal, a method thereof, and a program.

BACKGROUND ART

Recent years have seen, in various situations, the use of applications that provide tactile stimuli via a tactile presentation device which is in contact with human skin. The "tactile presentation" herein means generating tactile stimuli.

For example, in a mobile terminal with a touch panel such as a smartphone, the panel (or case) is vibrated at the time of touch operation on the panel to give a tactile stimulus to a finger, which provides a pseudo touch on a button.

As for music listening, a tactile presentation device is incorporated into a headphone housing, and tactile stimuli are given in parallel with music playback to emphasize heavy bass.

In the field of computer games and virtual reality (VR), a tactile presentation device installed in a controller provides tactile stimuli interactively in accordance with a scene in response to user operation, which enhances the user's sense of immersion.

In some amusement facilities, a tactile presentation device, installed in a seat in a movie theater, a theme park, or the like, provides tactile stimuli in accordance with a scene, which enhances the realistic feeling of visitors.

Further, in a research and development stage, there is a technology with which to control a robot or the like remotely, vibrations received by the robot or an object to be operated are fed back to a controller in hand of an operator to allow the operator to perceive intuitively the situation around the robot or the object, which is useful for danger prediction (example: disaster response robot <http://www.rm.is.tohoku.ac.jp/quince_mech/#_8>).

Further, in the medical field, research has been conducted to improve the surgical precision by giving, during operation of a surgical robot, an operator a feedback of the feel (hardness) of endoscope forceps touching an organ (example: surgery support robot Da Vinci <http://techon.nikkeibp.co.jp/article/FEATURE/20150217/404460/?P=2>).

Note that Patent Document 1 provided below can be mentioned as a related conventional technology. Patent Document 1 discloses a technology for not generating a tactile signal representing a pattern of tactile stimuli by sensing vibrations or the like but generating a tactile signal on the basis of an audio signal.

CITATION LIST

Patent Document

Patent Document 1: Japanese Patent Application Laid-Open No. 2015-53038

SUMMARY OF THE INVENTION

Problems to be Solved by the Invention

Here, as for a tactile reproduction system for reproducing a tactile signal, it is conceivable to realize real-time tactile reproduction by preparing a plurality of tactile presentation devices to give tactile stimuli to a plurality of parts of a human body, or by sending a tactile signal via a network such as the Internet.

However, with an increase in number of parts given tactile stimuli, the number of channels of the tactile signal also increases, which leads to an increase in amount of data. The increase in amount of data for the tactile signal possibly increases the processing load related to tactile reproduction, possibly causes a transmission delay, and so on, which are not desirable.

The present technology has been made in view of the above circumstances, and an object thereof is to improve the efficiency of a tactile reproduction system by reducing the amount of data for a tactile signal while tactile reproducibility is ensured.

Solutions to Problems

A decoding device according to the present technology includes a decoding unit configured to decode a tactile signal encoded for each of frequency bands.

This enables efficient encoding in which bit distribution for a tactile signal which is difficult for humans to perceive due to the tactile properties is reduced.

In the decoding device according to the present technology, the encoded tactile signal preferably includes a tactile signal on the basis of a detection signal of a tactile sensor.

Accordingly, it is possible to perform tactile reproduction on the basis of a tactile signal actually sensed.

In the decoding device according to the present technology, the encoded tactile signal preferably includes a tactile signal encoded for each of the frequency bands according to properties of a receptor.

This enables efficient encoding that reduces bit distribution for a tactile signal which is difficult for humans to perceive in terms of difference in properties of each receptor.

In the decoding device according to the present technology, the encoded tactile signal preferably includes a tactile signal encoded for each of the frequency bands in a time domain after band-split.

This eliminates the need to perform orthogonal transform on a tactile signal in order to realize efficient encoding that reduces bit distribution for a tactile signal which is difficult for humans to perceive.

In the decoding device according to the present technology, the encoded tactile signal preferably is different, between at least a part of the frequency bands, in at least one of quantization bit length or a sampling frequency.

This makes it possible to reduce the quantization bit length or to lower the sampling frequency for a tactile signal in at least one frequency band, leading to the reduction in amount of data for the tactile signal.

In the decoding device according to the present technology, the encoded tactile signal preferably includes a tactile signal encoded for each of the frequency bands in a frequency domain after orthogonal transform.

Accordingly, the degree of freedom for bit reduction according to the frequency is improved, which allows for more efficient encoding.

In the decoding device according to the present technology, the encoded tactile signal preferably includes a tactile signal encoded with a tactile signal component smaller than a predetermined amplitude threshold excluded from a target for quantization and encoding.

Accordingly, it is possible to perform encoding for excluding, from the target for quantization, a tactile signal component which is difficult for humans to perceive in terms of signal amplitude value.

In the decoding device according to the present technology, the encoded tactile signal preferably includes a tactile signal encoded by quantization with numbers of quantization steps different between at least a part of the frequency bands.

This makes it possible to reduce the number of quantization steps for a part of the frequency bands as compared to the other frequency bands.

In the decoding device according to the present technology, the encoded tactile signal preferably includes an entropy-encoded tactile signal.

Accordingly, it is possible to perform efficient encoding by reducing the amount of encoding for a symbol appearing frequently.

In the decoding device according to the present technology, it is preferable that the decoding unit individually output the decoded tactile signal for each of the frequency bands.

Accordingly, it is possible to perform tactile reproduction by using different tactile presentation devices for each receptor.

In the decoding device according to the present technology, the encoded tactile signal preferably includes a plurality of tactile signals acquired by encoding frequency bands corresponding to a detection signal of a plurality of tactile sensors.

Accordingly, it is possible to perform tactile reproduction by using different tactile sensors for each receptor.

Further, a decoding method according to the present technology is a decoding method including decoding a tactile signal encoded for each of frequency bands.

Even with such a decoding method, an operation similar to that of the decoding device according to the present technology can be obtained.

Further, a program according to the present technology is a program that causes an information processing device to implement a function of decoding a tactile signal encoded for each frequency band.

Such a program according to the present technology implements the decoding device according to the present technology.

Effects of the Invention

According to the present technology, it is possible to reduce the amount of data for a tactile signal while tactile reproducibility is ensured, and to improve the efficiency of a tactile reproduction system.

Note that the effect described herein is not necessarily a limitative one, and any of the effects described in the present disclosure is possible.

MODE FOR CARRYING OUT THE INVENTION

Hereinafter, embodiments according to the present technology are described in the following order with reference to the accompanying drawings.
<1. First Embodiment>
[1-1. Overview of Tactile Reproduction System]
[1-2. Configuration of Encoding Device]
[1-3. Configuration of Reproduction Device]
[1-4. First Example]
  (Encoding Method)
  (Encoding-side Configuration)
  (Decoding Method)
  (Decoding-side Configuration)
[1-5. Second Example]
[1-6. Third Example]
[1-7. Fourth Example]
<2. Second Embodiment>
[2-1. Encoding Method]
[2-2. Encoding-side Configuration]
[2-3. Decoding-side Configuration]
<3. Modification to Embodiments>
<4. Summary of Embodiments>
<5. Present Technology>

Here, in this specification, each term is defined as follows.

Tactile stimulus: A physical phenomenon that allows a person to perceive a tactile sense such as a vibration phenomenon.

Tactile presentation: To generate a tactile stimulus.

Tactile signal: A signal representing a pattern of tactile stimuli, such as a signal representing a vibration waveform, for example. In a narrow sense, a tactile signal is an analog signal or a digital signal; however, in a broad sense, a tactile signal represents information itself perceived by a tactile sense of a human (including information that can be perceived only in a specific frequency band or amplitude domain such as a vibration).

Recipient: A person who receives a tactile presentation.

Tactile properties: Properties related to a tactile sense of a human. The tactile properties are different depending on parts (hands, face, feet, etc.) and receptors.

Tactile sensitivity: Sensitivity to the subjective intensity of tactile stimuli as the tactile stimuli are perceived. The tactile sensitivity is different depending on receptors and parts of a human body.

1. First Embodiment 1-1. Overview of Tactile Reproduction System

Figure 1:
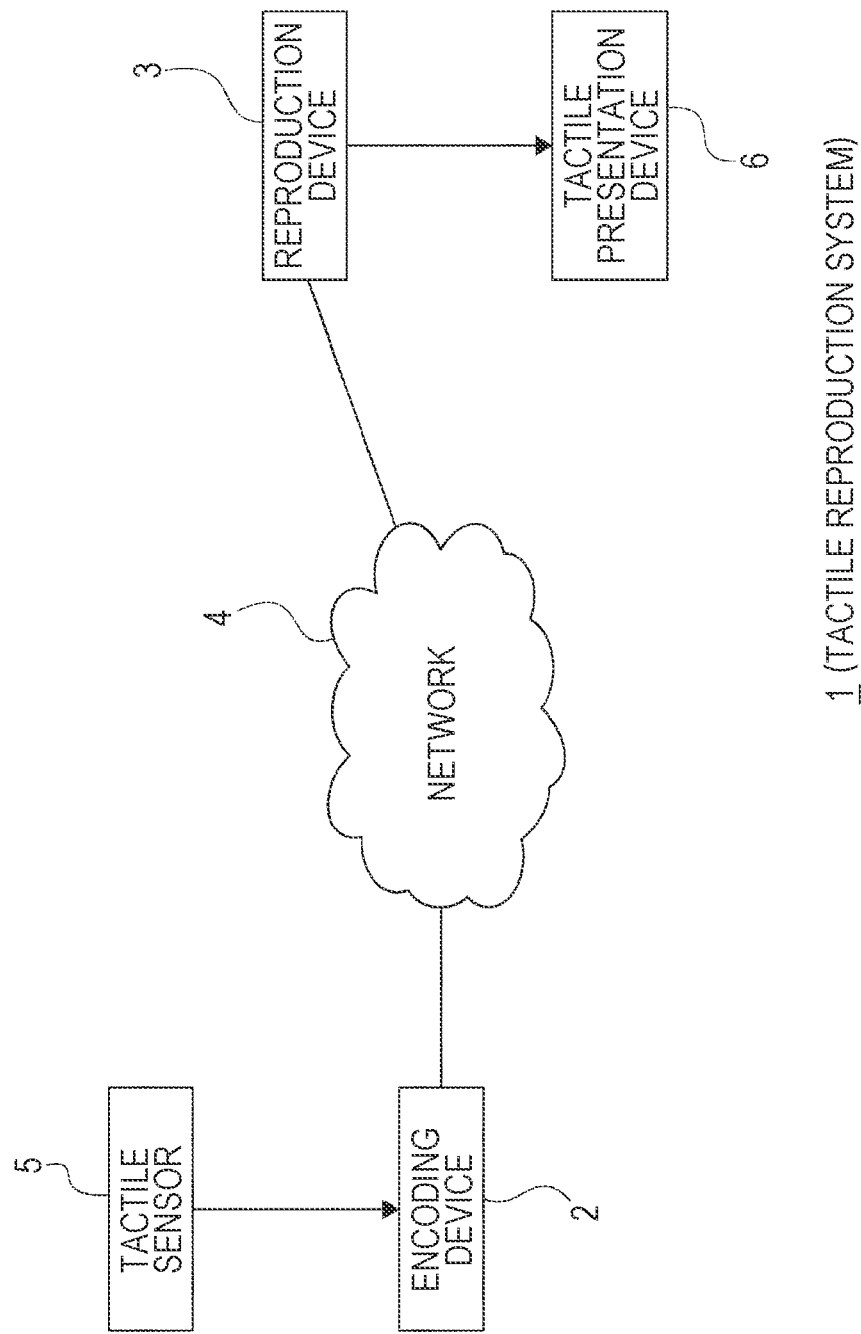
FIG. 1 is a diagram showing an example of the configuration of a tactile reproduction system including a decoding device according to a first embodiment of the present technology.

FIG. 1 is a diagram showing an example of the configuration of a tactile reproduction system 1 including a decoding device (reproduction device 3) according to a first embodiment of the present technology.

The tactile reproduction system 1 includes an encoding device 2 to which a tactile sensor 5 is connected, a reproduction device 3 configured to perform communication with the encoding device 2 via a predetermined network 4, and a tactile presentation device 6 connected to the reproduction device 3.

Here, since the tactile sense is distributed throughout a human body, it is conceivable that the tactile presentation device 6 is attached to a plurality of parts of the human body to reproduce the tactile sense; however, for simplicity of explanation, an example is taken of reproducing a tactile signal obtained in a case where a single part of the human body such as a fingertip touches vibrations of an object for example, and the tactile reproduction system 1 is assumed to have one tactile sensor 5 and one tactile presentation device 6 as illustrated.

The tactile sensor 5 is a sensor that senses a tactile signal, and in this example, the tactile sensor 5 is a vibration sensor such as a piezo pickup or an acceleration sensor. The tactile sensor outputs a vibration or a motion as a voltage change when the tactile sensor is brought into contact with an object to be sensed.

In this example, the tactile sensor 5 is connected to the encoding device 2 by wire.

The encoding device 2 includes a computer device such as a central processing unit (CPU) or a digital signal processor (DSP), and encodes a detection signal (tactile signal) by the tactile sensor 5 according to a predetermined data format, and sends the encoded tactile signal to the reproduction device 3 via the predetermined network 4 such as the Internet.

The reproduction device 3 includes a computer device such as a CPU or a DSP, decodes (reproduces) the encoded tactile signal, which is received via the network 4, and drives the tactile presentation device 6 on the basis of the decoded tactile signal.

The tactile presentation device 6 is used as a device for generating tactile stimuli, and in this example, a vibration device such as a vibrator or an actuator is used as the tactile presentation device 6.

The tactile presentation device 6 is attached to a recipient (fingertip in this example), and reproduces a tactile signal sensed by the tactile sensor 5.

The tactile reproduction system 1 of this example is configured as a system available even if an environment in which a tactile signal is sensed and an environment in which the tactile signal is reproduced are remotely provided. In the configuration of the tactile reproduction system 1 shown in FIG. 1, a tactile sense can be reproduced in substantially real time by sending a tactile signal obtained by the sensing with the tactile sensor 5 to the reproduction device 3 side via the network 4.

1-2. Configuration of Encoding Device

Figure 2:
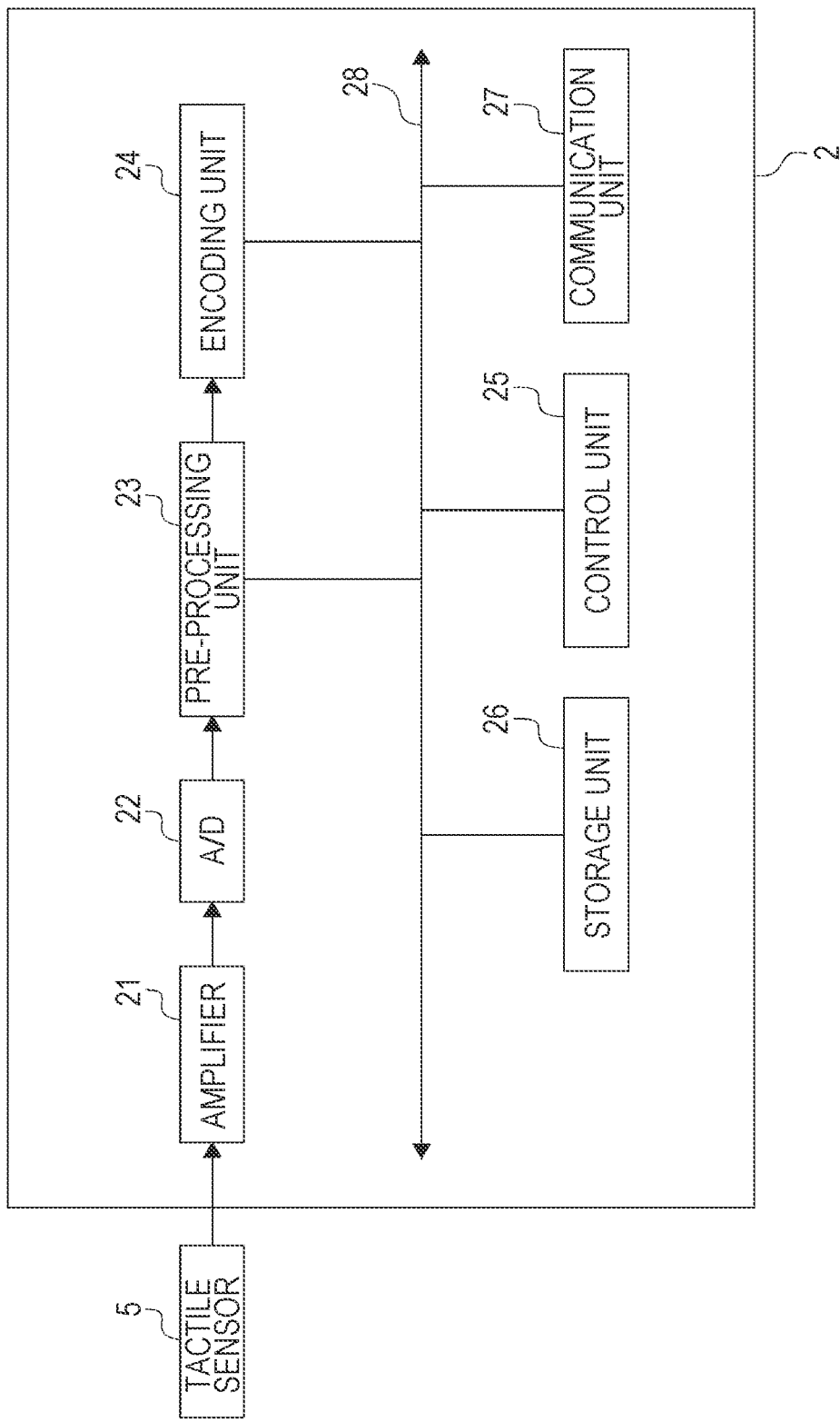
FIG. 2 is a diagram for explaining an example of the internal configuration of an encoding device according to the first embodiment.

FIG. 2 is a diagram for explaining an example of the internal configuration of an encoding device 2. FIG. 2 also shows the tactile sensor 5 shown in FIG. 1 together with the example of the internal configuration of the encoding device 2.

As illustrated, the encoding device 2 includes an amplifier 21, an A/D converter 22, a pre-processing unit 23, an encoding unit 24, a control unit 25, a storage unit 26, a communication unit 27, and a bus 28.

As illustrated, the pre-processing unit 23, the encoding unit 24, the control unit 25, the storage unit 26, and the communication unit 27 are connected to one another via the bus 28 to perform mutual data communication.

A detection signal (a form of a tactile signal representing a pattern of tactile stimuli) of the tactile sensor 5 is input to the amplifier 21 for adjustment to an appropriate dynamic range, is input to the A/D converter 22 for A/D conversion (analog/digital conversion), and then is input to the pre-processing unit 23. In the pre-processing unit 23, various digital signal processing such as noise removal and calibration of the sensor characteristics of the tactile sensor 5 are performed.

The tactile signal that has been subjected to the signal processing by the pre-processing unit 23 is input to the encoding unit 24.

The encoding unit 24 is implemented by, for example, a DSP, and encodes the input tactile signal according to a predetermined data format. A specific method for encoding the tactile signal is described later.

The control unit 25 includes a microcomputer having, for example, a CPU, a read only memory (ROM), a random access memory (RAM), and so on, and executes processing according to a program stored in the ROM to execute overall control of the encoding device 2.

For example, the control unit 25 performs data communication with an external device via the communication unit 27.

The communication unit 27 is configured to perform data communication with an external device via the network 4, and the control unit 25 can perform data communication with an external device connected to the network 4 (particularly, the reproduction device 3 in this example) via the communication unit 27. In particular, the control unit 25 can perform control so that the tactile signal encoded by the encoding unit 24 is sent to the reproduction device 3 via the communication unit 27.

The storage unit 26 comprehensively represents a storage device such as a hard disk drive (HDD) or a solid state drive (SSD), and is used for storing various data in the encoding device 2. For example, the storage unit 26 stores, therein, data necessary for control by the control unit 25. Further, the storage unit 26 can store, therein, the encoded tactile signal on the basis of the control by the control unit 25.

1-3. Configuration of Reproduction Device

Figure 3:
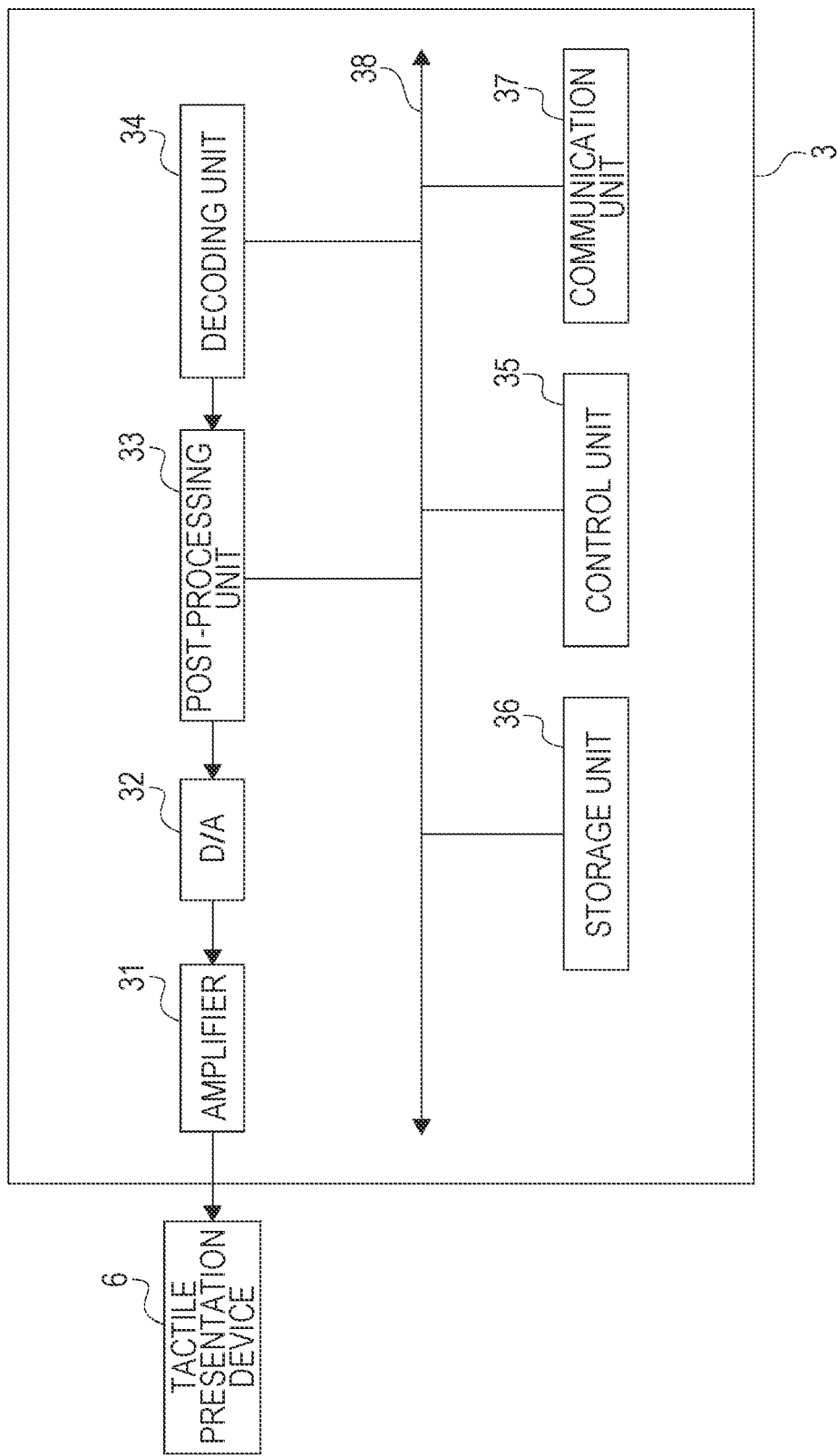
FIG. 3 is a diagram for explaining an example of the internal configuration of a decoding device according to the first embodiment.

FIG. 3 is a diagram for explaining an example of the internal configuration of the reproduction device 3, and also shows the tactile presentation device 6 shown in FIG. 1 together with the example of the internal configuration of the reproduction device 3.

The reproduction device 3 includes an amplifier 31, a D/A converter 32, a post-processing unit 33, a decoding unit 34, a control unit 35, a storage unit 36, a communication unit 37, and a bus 38.

The post-processing unit 33, the decoding unit 34, the control unit 35, the storage unit 36, and the communication unit 37 are connected to one another via the bus 38 to perform mutual data communication.

The control unit 35 includes a microcomputer having, for example, a CPU, a ROM, a RAM, and so on, and executes processing according to a program stored in the ROM to execute overall control of the reproduction device 3.

For example, the control unit 35 performs data communication with an external device via the communication unit 37.

The communication unit 37 is configured to perform data communication with an external device via the network 4, and the control unit 35 can perform data communication with an external device connected to the network 4 (particularly, the encoding device 2 in this example) via the communication unit 37.

The control unit 35 causes the tactile signal (encoded tactile signal) received from the encoding device 2 by the communication unit 37 to be input to the decoding unit 34.

The storage unit 36 comprehensively represents a storage device such as an HDD and an SSD, and is used for storing various data in the reproduction device 3. For example, the storage unit 36 stores, therein, data necessary for control by the control unit 35.

The decoding unit 34 decodes the encoded tactile signal according to a predetermined data format. The decoded tactile signal is input to the post-processing unit 33.

The post-processing unit 33 performs signal processing such as calibration of the tactile presentation device 6 and predetermined filter processing on the input tactile signal as necessary.

The tactile signal that has passed through the post-processing unit 33 is input to the D/A converter 32 where D/A conversion (digital/analog conversion) is performed on the tactile signal, is adjusted to an appropriate dynamic range by the amplifier 31, and then is outputted to the tactile presentation device 6.

Accordingly, the tactile presentation device 6 is driven on the basis of the tactile signal, which enables tactile stimuli to be sensed in a detection environment to be given to the recipient (in other words, the tactile signal can be reproduced).

Note that only the tactile signal is referred to above; however, an audio signal or a video signal can be sent, together with the tactile signal, to the reproduction device 3 side to provide a sound or an image to the recipient.

1-4. First Example (Encoding Method)

Hereinafter, a tactile reproduction method according to the first example of the first embodiment is described.

First, irrespective of the first or second embodiment, the tactile reproduction method according to the embodiment is a method in which human tactile properties are focused.

Figure 4:
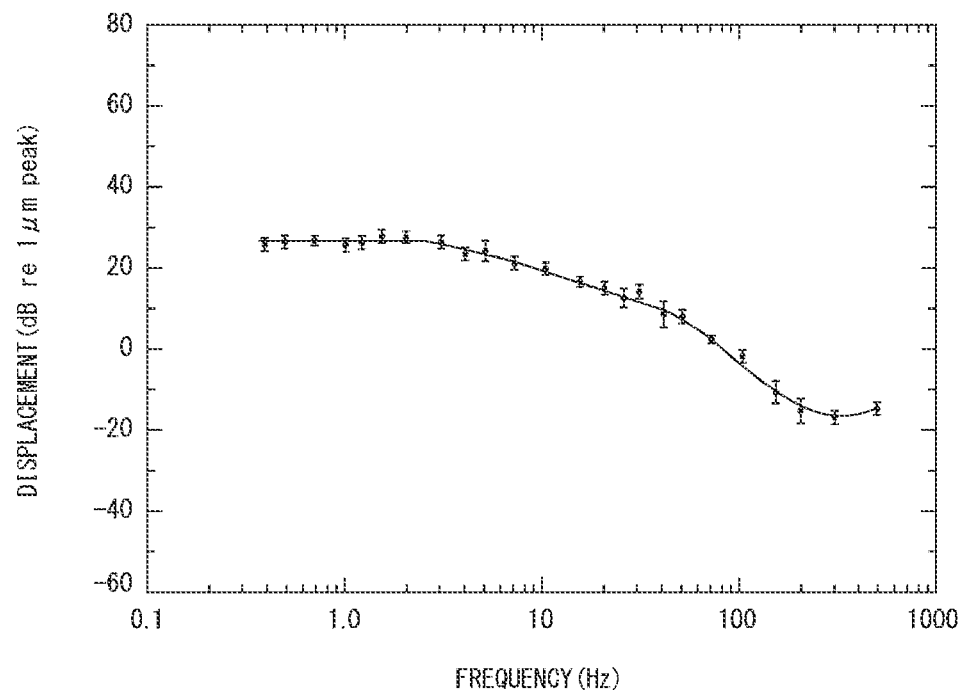
FIG. 4 is an explanatory diagram of a vibration detection threshold curve.

As a measure of human tactile sensitivity, a vibration detection threshold curve shown in FIG. 4 has been reported. In FIG. 4, the horizontal axis represents frequency and the vertical axis represents the magnitude of tactile stimuli (vibration: displacement herein).

The vibration detection threshold curve shown in FIG. 4 is an example of an experiment to determine whether or not humans perceive the vibration as a tactile sense, that is, tactile sensitivity. Humans cannot perceive vibrations less than those shown in this curve as a tactile sense.

Here, it is commonly known that there is a plurality of receptors for perception of a tactile sense under the human skin. As representative receptors, Meissner, Merkel, Ruffini, and Pacinian are known.

Meissner and Pacinian are also called "FA 1" and "FA 2", respectively, and FA is an abbreviation of "fast adapting". Merkel and Ruffini are also called "SA 1" and "SA 2", respectively, and SA is an abbreviation of "slow adapting".

Figure 5:
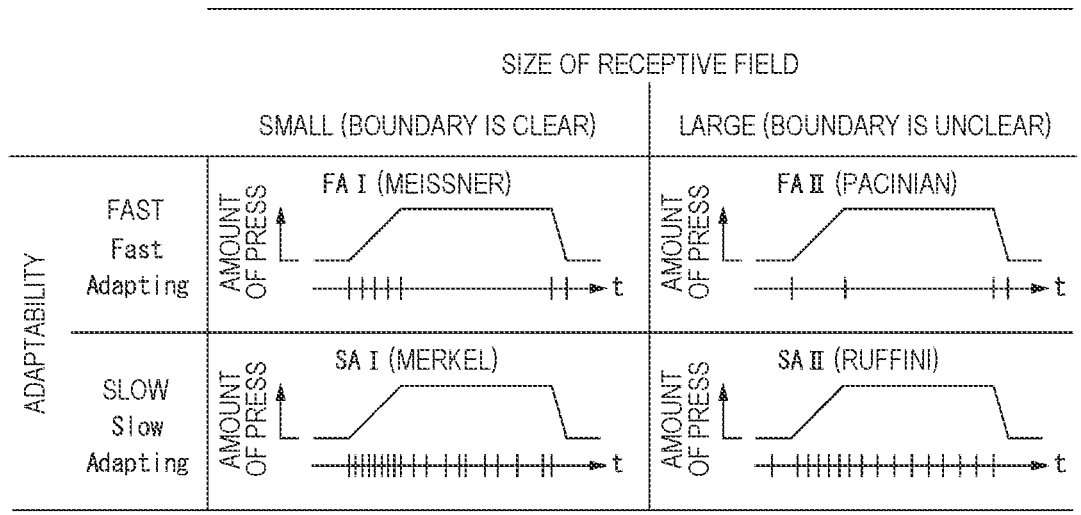
FIG. 5 is a diagram showing an example of the distribution of neural firing for each receptor.

FIG. 5 shows the distribution of neural firing for each receptor when an object is gradually pressed against the skin, and held for a while before the object is released.

Merkel (SA 1) performs neural firing continuously while the object is pressed against the skin and is supposed to detect the strength (displacement, pressure). Meissner (FA 1) is supposed to detect an interval until the amount of press of the object becomes constant, that is, to detect a velocity. Pacinian (FA 2) is supposed to be responsible for detection of an interval in which the amount of press changes, that is, detection of acceleration.

Figure 6:
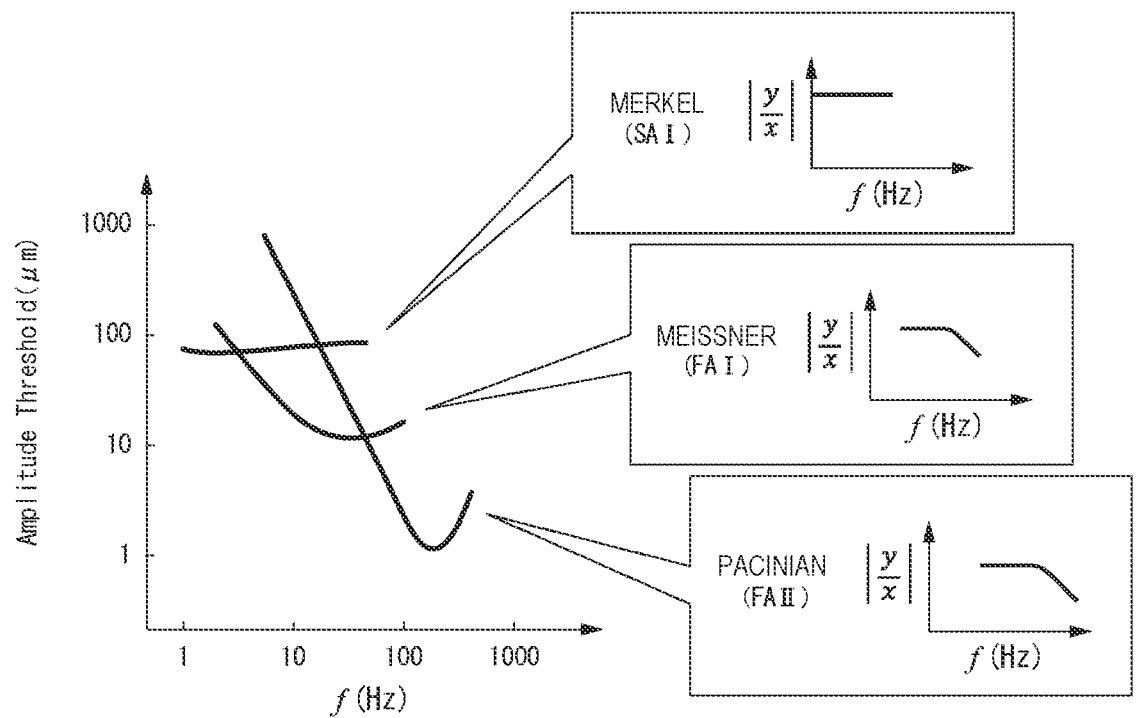
FIG. 6 is an explanatory diagram of a vibration detection threshold curve for each receptor.

FIG. 6 shows a vibration detection threshold curve for each receptor. The curve shown in FIG. 4 does not show the properties of a single receptor but show combined properties of tactile senses obtained by the plurality of receptors as shown in FIG. 6.

The vibration detection threshold curves of FIG. 4 and FIG. 6 indicate that a human can perceive vibrations up to approximately 1 kHz as tactile stimuli. Further, although values equal to or more than 1 kHz are not described in FIG. 4 and FIG. 6, it is known that humans can actually perceive, as tactile stimuli, even vibrations with a frequency of approximately a few kHz, although the sensitivity is not high.

Most of conventional applications for tactile reproduction, the targets are vibrations up to approximately 200 Hz at most. This is due to the fact that the highest tactile sensitivity of humans is approximately 200 Hz.

However, as described above, various experiments in the past have shown that humans can perceive vibrations up to 1 kHz as tactile stimuli, and it must be said that it is difficult for the conventional applications to reproduce a tactile sense with a high sense of reality.

For example, vibrations when a cork is pulled out of a bottle has a high frequency of several kHz in reality. If the vibrations are reproduced only up to several hundred Hz, only a tactile sense completely different from the reality can be obtained.

In view of this, in this embodiment, the tactile signal and the characteristics of the tactile presentation device 6 are widened to approximately 1 kHz to enhance the sense of reality.

Specifically, in this embodiment, a method is employed in which a tactile signal is obtained by sensing tactile stimuli such as vibrations actually generated and the tactile signal is used for tactile presentation.

In recent years, all kinds of information have been digitized for use, and digitizing and handling tactile signals in a similar manner are considered.

The amount of digitized data can be considered in terms of bit length required per unit of time, that is, a bit rate. For example, in the vibration detection threshold curve shown in FIG. 4, an area that can be perceived by humans is at least 50 dB (−20 dB to 30 dB) or more on the vertical axis (vibration) and approximately 1000 Hz on the horizontal axis. In this example, the distribution of tactile signals actually perceived by humans is taken into consideration, and signals in the range of +20 dB from the threshold curve are supposed to be sensed.

Figure 7:
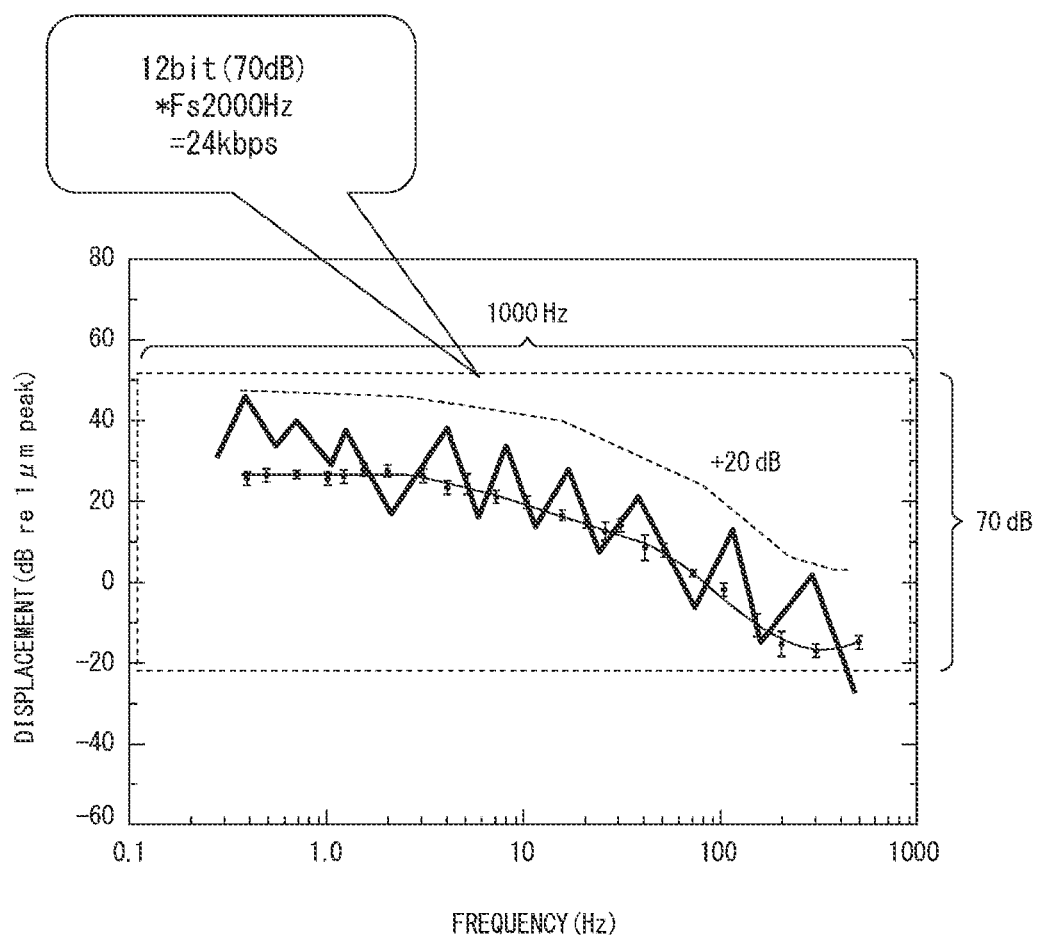
FIG. 7 is a diagram illustrating an amplitude domain and a frequency domain which are the targets for digitization of a tactile signal.

Specifically, as shown in FIG. 7, the range of vibration is assumed to be 70 dB (−20 dB to 50 dB).

In a case where this signal is digitized by linear pulse code modulation (LPCM), since one bit can only represent 6 dB, in order to reproduce up to 12 bits and 1000 Hz on the vertical axis, a sampling frequency of 2000 Hz (sample/sec) which is twice as high as 1000 Hz is required, so the required bit rate B0 is calculated by [Equation 1] below.

$$B0 = 12 \text{ bit/sample} \times 2000 \text{ sample/sec} = 24 \text{ kbit/sec} \quad \text{[Equation 1]}$$

The value itself is very small as compared to, for example, a bit rate of a compact disc (CD), which is a typical format for audio signals, of 1411 kbit/sec, so it seems unlikely to be a major problem even if the tactile signal is additionally built into some system.

However, as described above, it is known that a band of a tactile signal that humans can perceive extends to several kHz. For example, in a case where a tactile signal is reproduced up to 2000 Hz, the bit rate is twice as high as [Equation 1], which is 48 kbit/sec.

Further, unlike vision (two eyes) and hearing (two ears), the tactile sense exists everywhere on the surface of the human body. As for only fingertips of both hands, there are 10 locations, and if all of the tactile signals are to be handled, the bit rate further increases by a factor of 10 to 480 kbit/sec. If the location is increased, for example, finger joints and palms, the bit rate increases dramatically.

Further, the tactile signal is basically a one-dimensional signal; however, the physical phenomenon of vibrations can be considered in three axes (x, y, z). Attempting to handle all of these would require further three times of the bit rate of 1440 kbit/sec, which is as large as 1411 kbit/sec of an audio CD.

As described above, although the bit rate for a single tactile signal is not so high, it is a huge amount considering the tactile sense that humans can sense, and it is certain that a significant load is imposed on a system handling the tactile signal.

To address this, in this embodiment, the bit rate of a tactile signal is reduced by performing encoding in consideration of human tactile properties.

Specifically, in the first example, in the vibration detection threshold curves shown in FIG. 4 and FIG. 7, attention is paid to the characteristic that a vibration detection threshold is significantly reduced on the high frequency side, and an encoding method with a tactile signal split into two frequency bands is described.

Figure 8:
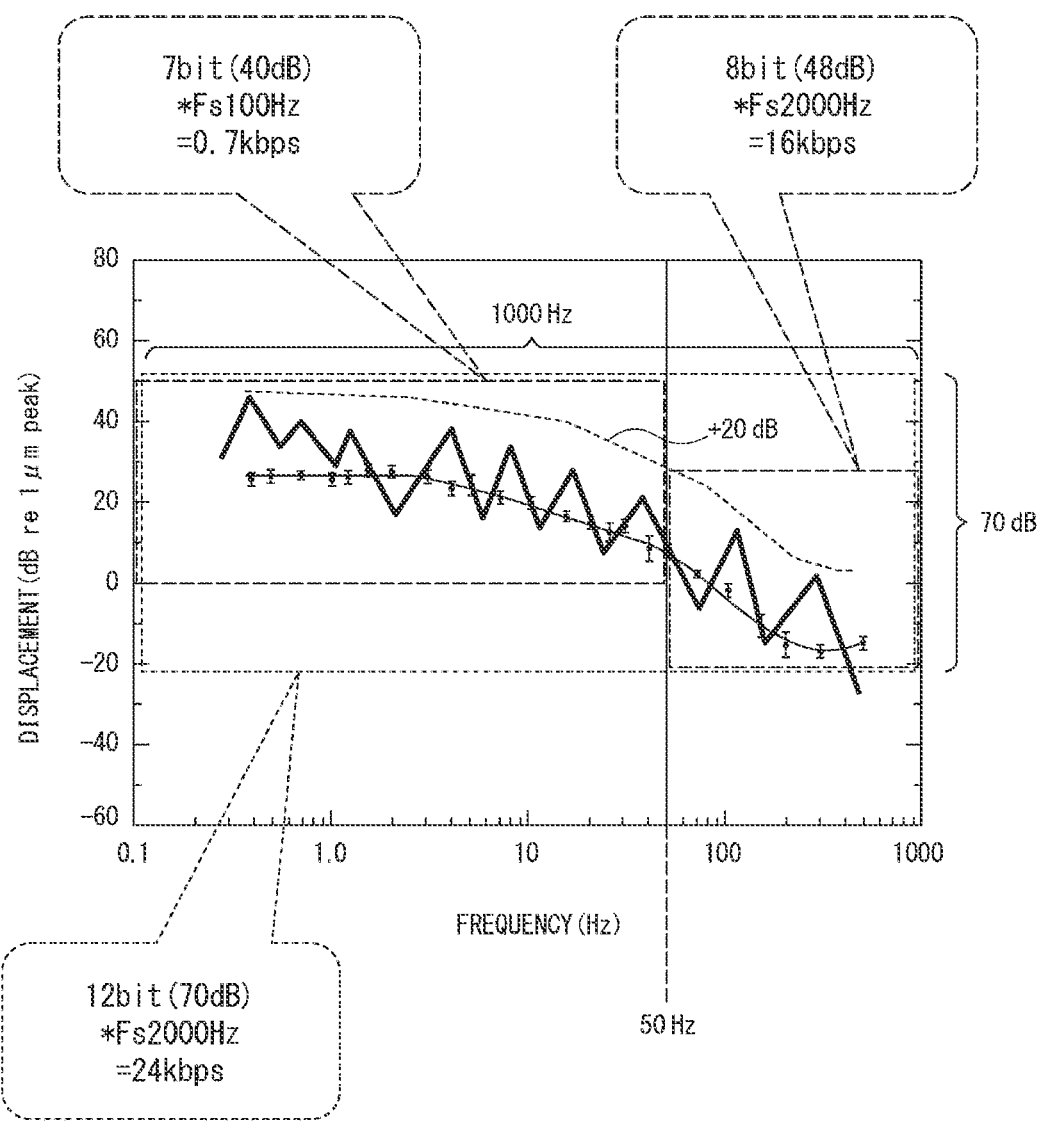
FIG. 8 is an explanatory diagram of an encoding method according to a first example of the first embodiment.

FIG. 8 is an explanatory diagram of an encoding method according to a first example.

In this example, a tactile signal as an LPCM signal is split into two frequency bands at 50 Hz, and encoding is performed as illustrated in which the quantization bit length is set to 7 bits (40 dB) and the sampling frequency is set to 100 Hz for a low frequency band (e.g., band less than 50 Hz), and the quantization bit length is set to 8 bits (48 dB) and the sampling frequency is set to 100 Hz for a high frequency band (e.g., band equal to or more than 50 Hz and equal to or less than 1 kHz).

In this case, a bit rate BL1 of the tactile signal for the low frequency band and a bit rate BH1 of the tactile signal for the high frequency band are represented respectively by [Equation 2] and [Equation 3] below.

$$BL1 = 7 \text{ bit/sample} \times 100 \text{ sample/sec} = 0.7 \text{ kbit/sec} \quad \text{[Equation 2]}$$

$$BH1 = 8 \text{ bit/sample} \times 2000 \text{ sample/sec} = 16 \text{ kbit/sec} \quad \text{[Equation 3]}$$

A total bit rate obtained by BL1+BH1 is 16.7 kbps, leading to reduction of approximately 30% as compared to a bit rate B0 without band-split.

(Encoding-Side Configuration)

Figure 9:
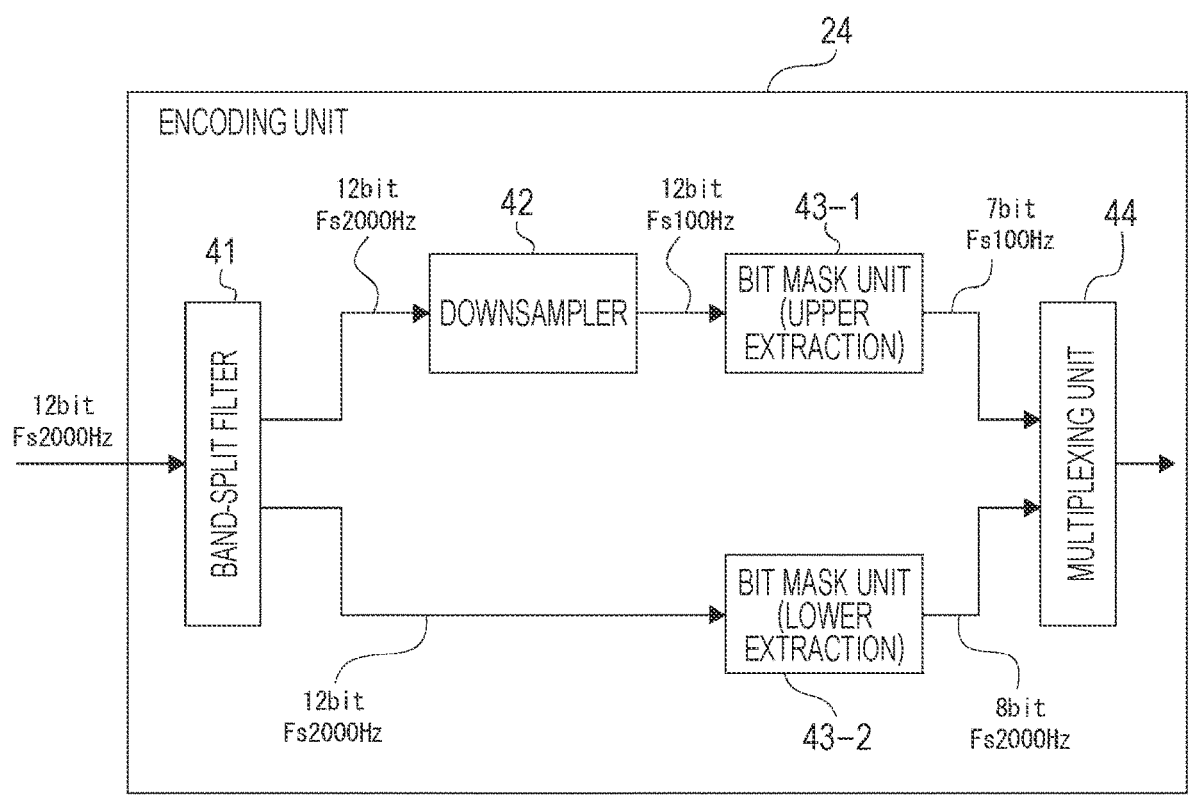
FIG. 9 is a diagram showing an example of the specific configuration of an encoding unit for implementing an encoding method according to the first example.

FIG. 9 is a diagram showing an example of the specific configuration of the encoding unit 24 for implementing an encoding method according to the first example.

Here, it is assumed that a tactile signal having the quantization bit length of 12 bits and a sampling frequency of 2000 Hz is input to the encoding unit 24.

As illustrated, the encoding unit 24 includes a band-split filter 41, a downsampler 42, a bit mask unit 43-1, a bit mask unit 43-2, and a multiplexing unit 44.

The band-split filter 41 receives a tactile signal (quantization bit length=12 bits, sampling frequency=2000 Hz) from the pre-processing unit 23, performs frequency band split processing on the tactile signal to extract a component of the low frequency band (hereinafter referred to as a "low-frequency component") and a component of the high frequency band (hereinafter referred to as a "high-frequency component").

The low-frequency component of the tactile signal obtained by the band-split filter 41 is input to the downsampler 42 and undergoes a downsampling process. Specifically, the downsampling process is performed with a sampling frequency=100 Hz.

Then, the low-frequency component of the tactile signal downsampled by the downsampler 42 is reduced from 12 bits to 7 bits in the quantization bit length by extracting upper bits by the bit mask unit 43-1 and the resultant is input to the multiplexing unit 44.

Further, the high-frequency component of the tactile signal obtained by the band-split filter 41 is reduced from 12 bits to 8 bits in the quantization bit length by extracting lower bits by the bit mask unit 43-2 and the resultant is input to the multiplexing unit 44.

The multiplexing unit 44 multiplexes the low-frequency component received from the bit mask unit 43-1 and the high-frequency component received from the bit mask unit 43-2 to generate stream data described later.

Figure 10:
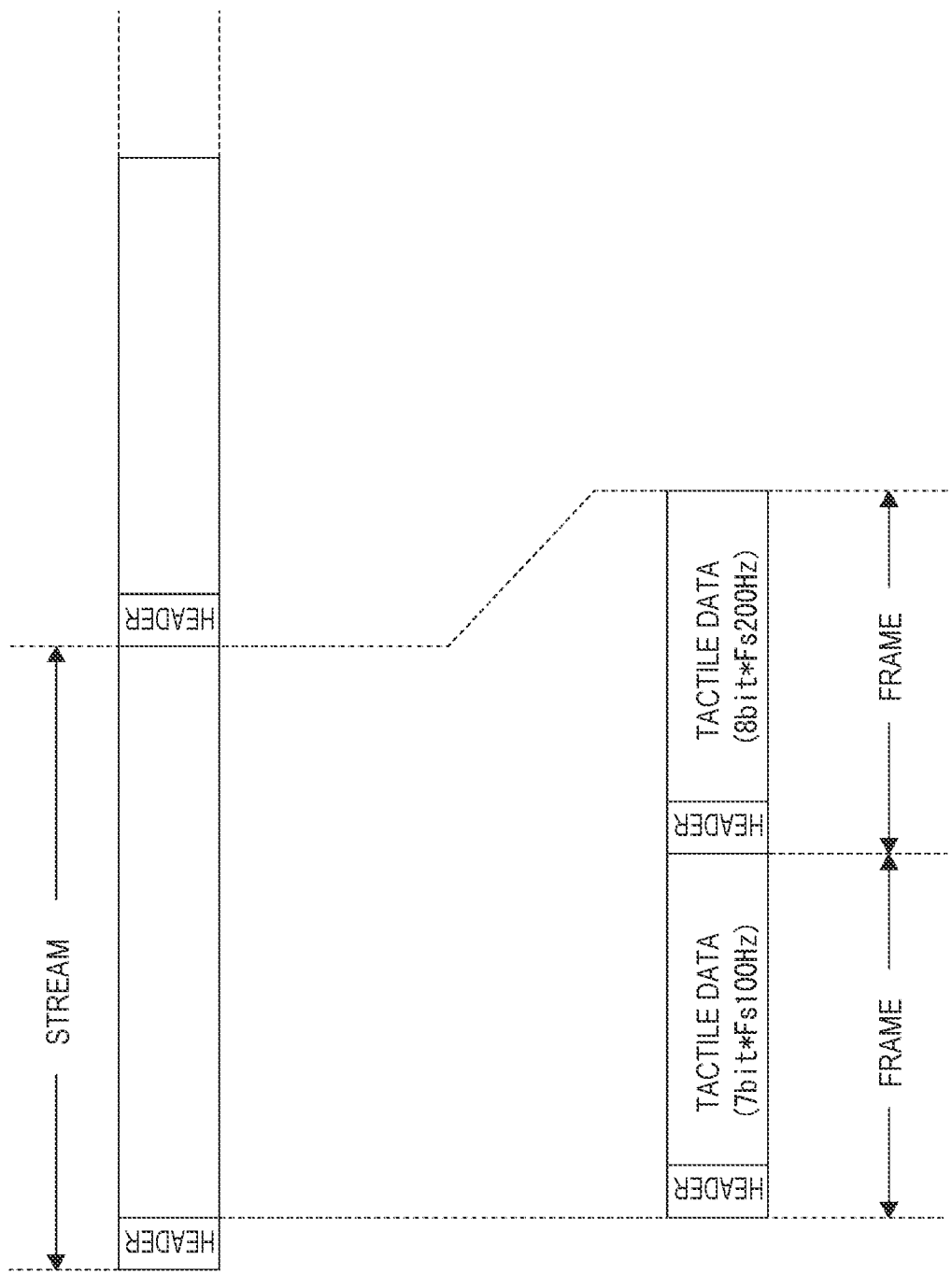
FIG. 10 is a diagram for explaining an example of multiplexing of a tactile signal.

FIG. 10 is a diagram for explaining an example of multiplexing of a tactile signal by the multiplexing unit 44.

In the multiplexing unit 44 of this example, the low-frequency component and the high-frequency component of the tactile signal are individually handled as data in units called frames. As illustrated, the frame has an area as a frame header and an area for storing actual data of the tactile signal. The frame header stores, as header information regarding frame, information with which the frame can be identified as one for a low-frequency component or one for a high-frequency component at least.

Further, the multiplexing unit 44 generates a unit of data, called a stream, which includes a frame for the low-frequency component and a frame for the high-frequency component. The stream has an area as a stream header and an area for storing each frame of the low-frequency component and the high-frequency component. The stream header includes, as header information, information indicating specifications of a digitized tactile signal (tactile data) (quantization bit length, sampling frequency, stream type, data size, etc.), and information regarding the number of frames included in the stream.

In this example, stream data by a manner in which the streams of each time obtained by the multiplexing are arranged on the time axis is used for recording and transmission of a tactile signal (tactile data).

On the reproduction device 3 side, the tactile signal is decoded on the basis of the stream data input from the encoding device 2 side.

In the above description, in a case where a tactile signal with the quantization bit length=12 bits and the sampling frequency=2000 Hz is input to the encoding unit 24, in other words, it is assumed that the A/D converter 22 is an A/D converter with the quantization bit length=12 bits and the sampling frequency=2000 Hz. However, in a case where the A/D converter 22 with a general quantization bit length (e.g., 16 bits, and the like) and the sampling frequency (e.g., 48 kHz, and the like) such as that used in the audio field for example, a sampling frequency conversion unit such as a downsampler is provided also for a tactile signal on the high frequency side, or a sampling frequency conversion unit such as a downsampler is provided at the preceding stage of the band-split filter 41.

(Decoding Method)

Figure 11:
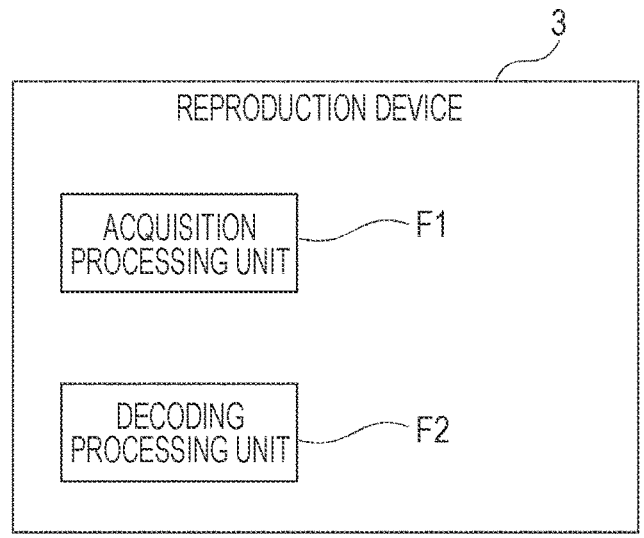
FIG. 11 is a functional block diagram for explaining a function of a decoding device according to an embodiment.

FIG. 11 is a functional block diagram for explaining a function related to decoding of the reproduction device 3.

As illustrated, the reproduction device 3 has functions operating as an acquisition processing unit F1 and a decoding processing unit F2.

The acquisition processing unit F1 acquires a tactile signal encoded for each frequency band. Specifically, in this example, the acquisition processing unit F1 acquires a low-frequency component and a high-frequency component of the tactile signal. In this example, the function as the acquisition processing unit F1 is implemented by the communication unit 37 shown in FIG. 3.

The decoding processing unit F2 decodes the tactile signal acquired by the acquisition processing unit F1. Specifically, in this example, the decoding processing unit F2 decodes the low-frequency component and the high-frequency component acquired by the acquisition processing unit F1. The decoding in this case is performed as processing for converting the data format of the tactile signal into the original data format. Specifically, the decoding in this case is performed as processing for converting each of the low-frequency component (quantization bit length=7 bits, sampling frequency=100 Hz) and the high-frequency component (quantization bit length=8 bits, sampling frequency=2000 Hz) into the original format of quantization bit length=12 bits and sampling frequency=2000 Hz.

The function as the decoding processing unit F2 is implemented by the decoding unit 34 in this example.

(Decoding-Side Configuration)

Figure 12:
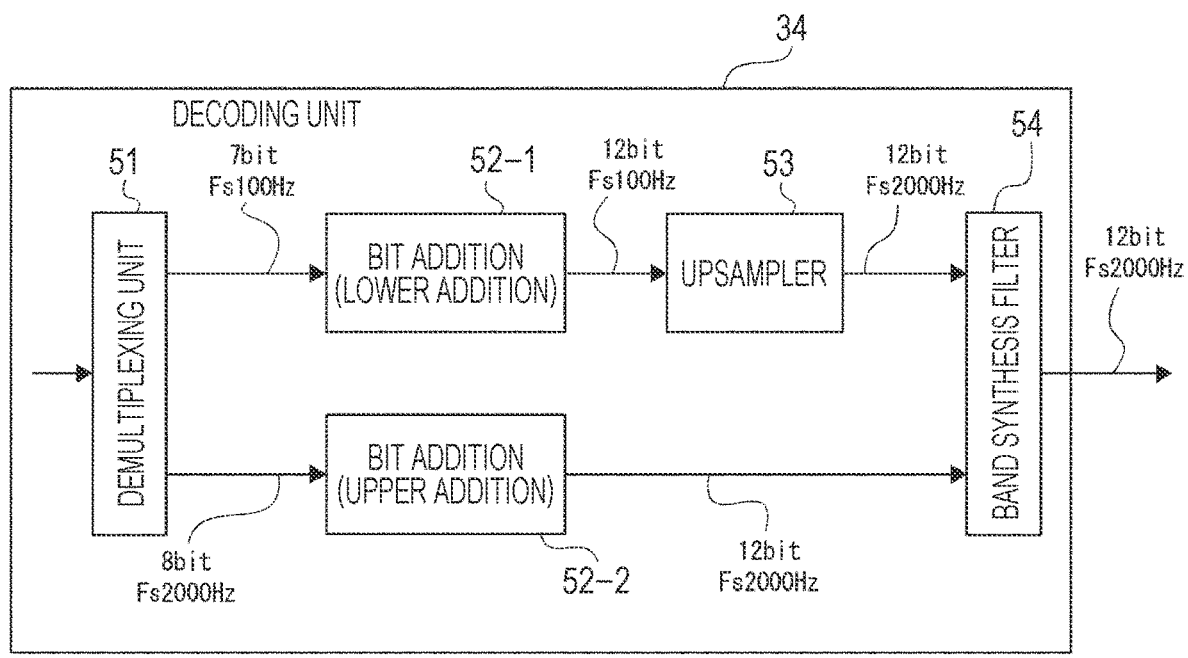
FIG. 12 is a diagram showing an example of the specific configuration of a decoding unit for implementing a decoding method according to the first example.

FIG. 12 is a diagram showing an example of the specific configuration of the decoding unit 34 for implementing a decoding method according to the first example.

As illustrated, the decoding unit 34 includes a demultiplexing unit 51, a bit addition unit 52-1, a bit addition unit 52-2, an upsampler 53, and a band synthesis filter 54.

The demultiplexing unit 51 receives the stream data (see FIG. 10) acquired by the communication unit 37, and separates the stream data to extract the low-frequency component and the high-frequency component of the tactile signal therefrom.

As illustrated, the extracted low-frequency component is converted into 12 bits in the quantization bit length by lower bits addition by the bit addition unit 52-1, the resultant undergoes an upsampling process by the upsampler 53 with a sampling frequency=2000 Hz, and then the resultant is input to the band synthesis filter 54.

Further, the high-frequency component extracted by the demultiplexing unit 51 is converted into 12 bits in the quantization bit length by upper bits addition by the bit addition unit 52-2, and then the resultant is input to the band synthesis filter 54.

The band synthesis filter 54 synthesizes the low-frequency component input from the upsampler 53 and the high-frequency component input from the bit addition unit 52-2 to output the resultant to the post-processing unit 33 shown in FIG. 3.

Note that although FIG. 12 illustrates a configuration on the assumption that the D/A converter 32 shown in FIG. 3 is a D/A converter corresponding to the quantization bit length=12 bits and the sampling frequency=2000 Hz, a D/A converter 32 corresponding to a general quantization bit length (e.g., 16 bits or the like) and the sampling frequency (e.g., 48 kHz or the like) such as that used in the audio field and the like can also be used. In such a case, a sampling frequency conversion unit such as an upsampler is provided also on the high-frequency component side, or a sampling frequency conversion unit such as an upsampler is provided at the subsequent stage of the band synthesis filter 54.

Here, the example in which the boundary frequency between the low-frequency component and the high-frequency component is set to 50 Hz is described above; however, the boundary frequency is not limited to 50 Hz, and it is only required to set the boundary frequency so that the total bit rate of a tactile signal is reduced on the basis of the vibration detection threshold curve shown in FIG. 4 and FIG. 7.

Further, in the above description, the example is given in which the number of frequency bands to be encoded is two; however, it is also possible to split into three or more frequency bands. For example, in FIG. 4 and FIG. 7, the split may be performed in such a manner that a band of less than 3 Hz, where the vibration detection threshold is kept almost constant from the low frequency side, is set to a first band, a band equal to or more than 3 Hz and less than 50 Hz, where the slope of the vibration detection threshold curve is relatively gradual after 3 Hz, is set to a second band, and a band equal to more than 50 Hz is set to a third band, and encoding is performed for each of the first, second, and third bands.

1-5. Second Example

Next, the second example of the first embodiment is described.

In the second example, a frequency band to be encoded is a band split according to the receptor properties.

As shown in FIG. 6, Merkel, Meissner, and Pacinian receptors have different frequency bands exhibiting a good response. Generally, it can be said that Merkel exhibits a good response in the low frequency, Meissner exhibits a good response in the middle frequency, and Pacinian exhibits a good response in the high frequency.

Figure 13:
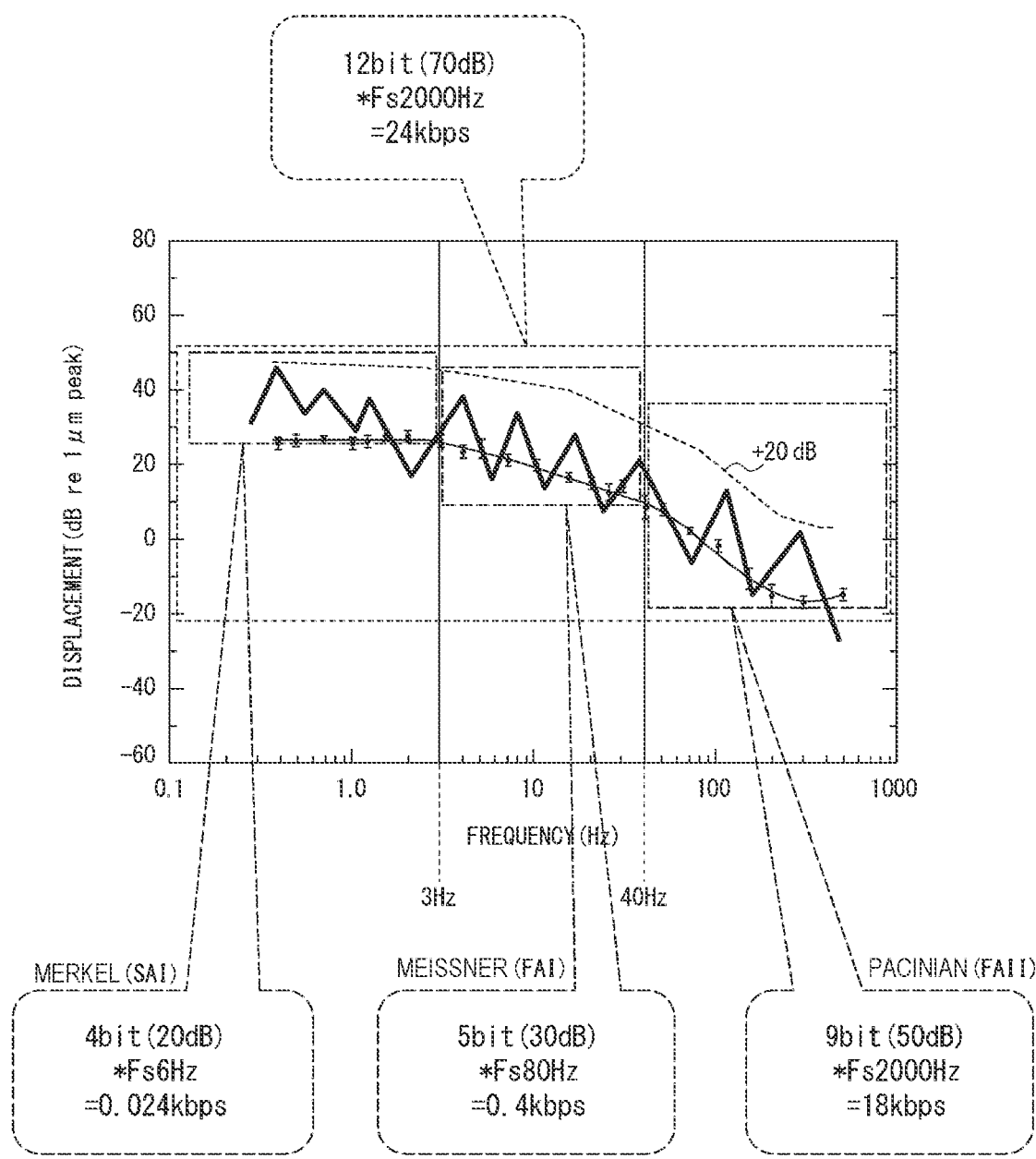
FIG. 13 is an explanatory diagram of an encoding method according to a second example.

In light of the above, in the second example, a frequency band to be encoded is split as shown in FIG. 13.

The properties of the receptors do not respond only to clearly split bands; however, here, as an example, the low frequency is defined as less than 3 Hz in accordance with the properties of Merkel, the mid frequency is defined as 3 Hz or more and less than 40 Hz in accordance with the properties of Meissner, and the high frequency is defined as 40 Hz or more and 1000 Hz or less in accordance with the properties of Pacinian, and the frequency bands to be encoded are set to the three frequency bands of low frequency, mid frequency and high frequency.

As illustrated, it is supposed that the low frequency component corresponding to Merkel (hereinafter referred to as "Merkel component") has the quantization bit length=4 bits (20 dB of a tactile signal) and the sampling frequency=6 Hz, and the mid frequency component corresponding to Meissner (hereinafter referred to as "Meissner component") has the quantization bit length=5 bits (30 dB) and the sampling frequency=80 Hz. Further, it is supposed that the high frequency component corresponding to Pacinian (hereinafter referred to as "Pacinian component") has the quantization bit length=9 bits (50 dB) and the sampling frequency=2000 Hz.

In this case, the bit rates BL2, BM2, and BH2 of the respective components of Merkel, Meissner, and Pacinian are calculated as shown in the following [Equation 4], [Equation 5], and [Equation 6], respectively.

$$BL2=4 \text{ bits/sample} \times 6 \text{ sample/sec} = 0.024 \text{ kbits/sec} \quad \text{[Equation 4]}$$

$$BM2=5 \text{ bits/sample} \times 80 \text{ sample/sec} = 0.4 \text{ kbits/sec} \quad \text{[Equation 5]}$$

$$BH2=9 \text{ bits/sample} \times 2000 \text{ sample/sec} = 18 \text{ kbits/sec} \quad \text{[Equation 6]}$$

In this case, the total bit rate of the tactile signal is 18.424 kbps, leading to the reduction of approximately 23% as compared to the total bit rate B0 described above.

Figure 14:
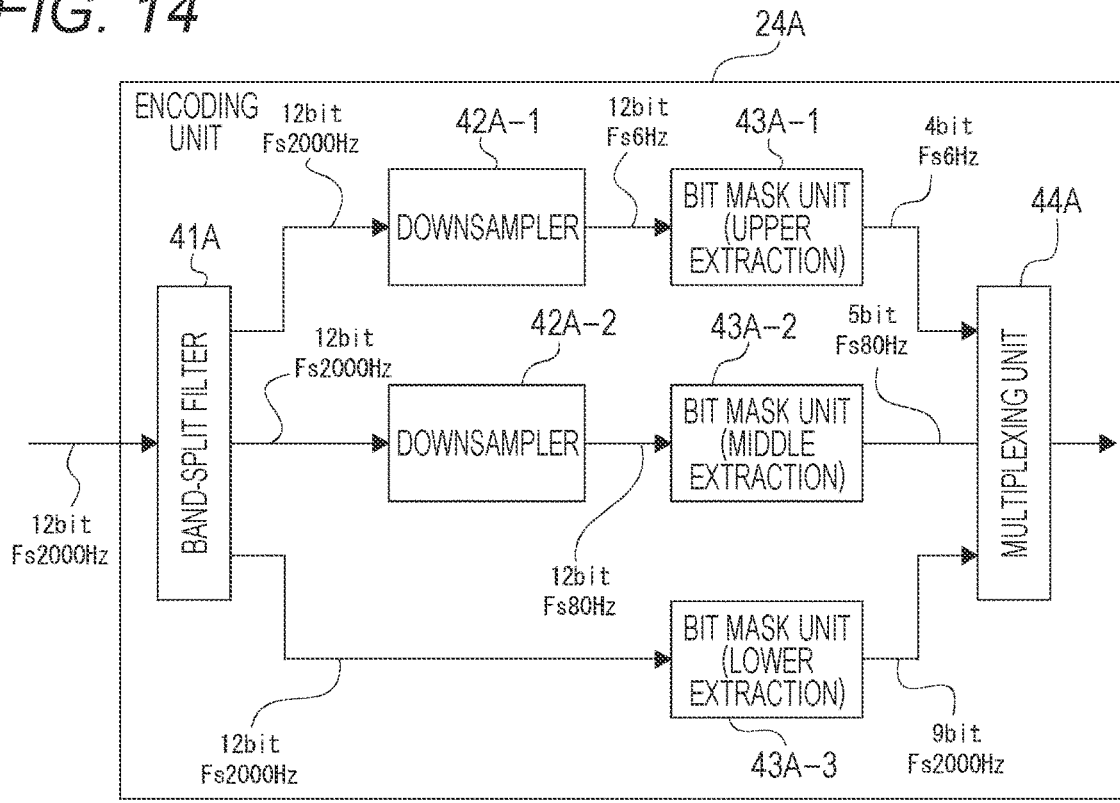
FIG. 14 is a diagram showing an example of the specific configuration of an encoding unit according to the second example.

FIG. 14 is a diagram showing an example of the specific configuration of an encoding unit 24A for implementing an encoding method according to the second example described above.

In the following description, portions that are similar to the portions already described are given the same reference numerals, and description thereof is omitted.

In the second example, the configuration of the encoding device 2 is similar to that of the first example except for the encoding unit 24, and therefore, explanation by illustration is omitted. In the encoding device 2 of the second example, an encoding unit 24A shown in FIG. 14 is provided instead of the encoding unit 24.

As illustrated, the encoding unit 24A includes a band-split filter 41A, a downsampler 42A-1, a downsampler 42A-2, a bit mask unit 43A-1, a bit mask unit 43A-2, a bit mask unit 43A-3, and a multiplexing unit 44A.

The band-split filter 41A receives, from the pre-processing unit 23, a tactile signal (quantization bit length=12 bits, sampling frequency=2000 Hz), performs frequency band split processing on the tactile signal to extract the Merkel component, Meissner component, and Pacinian component.

The Merkel component obtained by the band-split filter 41A is input to the downsampler 42A-1 and downsampled to a sampling frequency=6 Hz, and the Meissner component is input to the downsampler 42A-2 and downsampled to a sampling frequency=80 Hz.

The Merkel component thus downsampled is input to the multiplexing unit 44A after the quantization bit length is reduced from 12 bits to 4 bits by extracting the upper bits by the bit mask unit 43A-1. Further, the Meissner component thus downsampled is input to the multiplexing unit 44A after the quantization bit length is reduced from 12 bits to 5 bits by extracting the middle bits by the bit mask unit 43A-2.

Further, the Pacinian component obtained by the band-split filter 41A is reduced from 12 bits to 9 bits in the quantization bit length by extracting lower bits by the bit mask unit 43A-3 and the resultant is input to the multiplexing unit 44A.

The multiplexing unit 44A multiplexes the Merkel component, Meissner component, and the Pacinian component input from the bit mask units 43A-1, 43A-2, and 43A-3 to generate stream data. The multiplexing method herein is similar to the method described with reference to FIG. 10, and specifically, each component of Merkel, Meissner, and Pacinian is multiplexed to the same stream.

Figure 15:
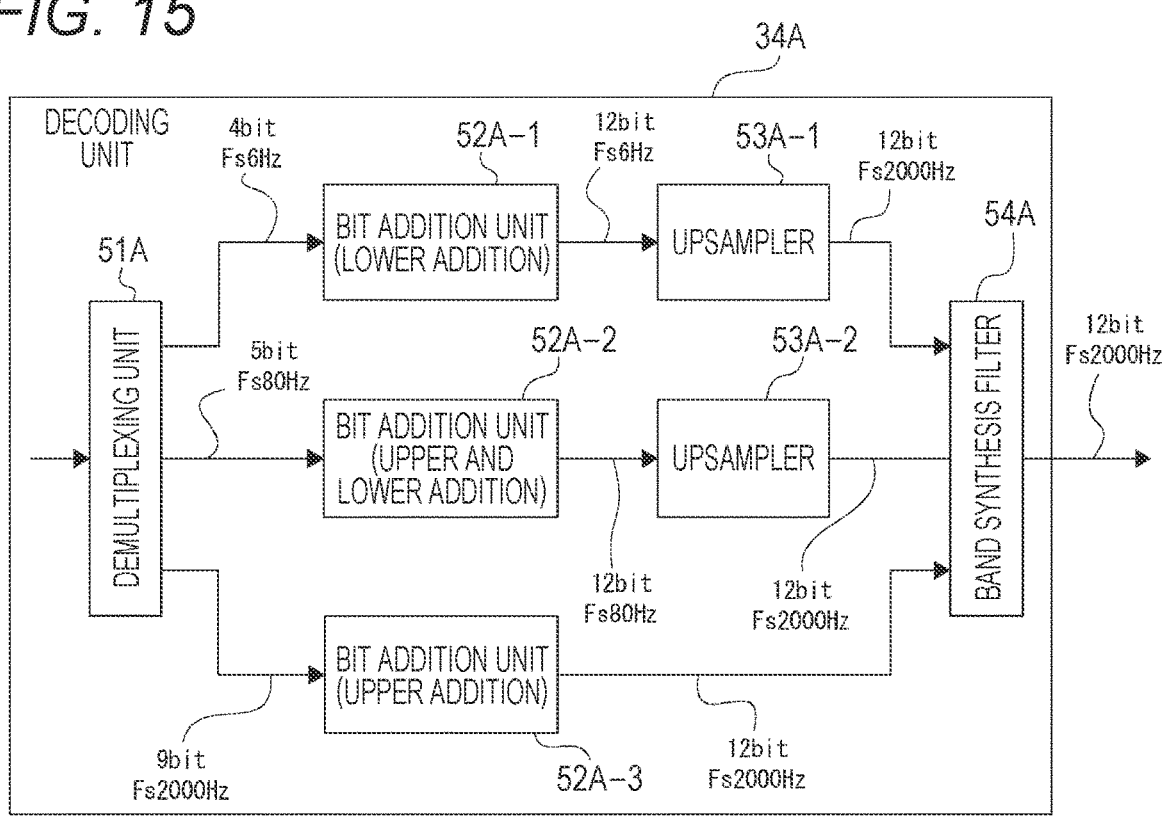
FIG. 15 is a diagram showing an example of the specific configuration of a decoding unit according to the second example.

FIG. 15 is a diagram showing an example of the specific configuration of a decoding unit 34A according to the second example for decoding the tactile signal encoded by the encoding unit 24A.

In the second example, the reproduction device 3 has the decoding unit 34A instead of the decoding unit 34.

As illustrated, the decoding unit 34A includes a demultiplexing unit 51A, a bit addition unit 52A-1, a bit addition unit 52A-2, a bit addition unit 52A-3, an upsampler 53A-1, an upsampler 53A-2, and a band synthesis filter 54A.

The demultiplexing unit 51A receives the stream data acquired by the encoding unit 24A via the communication unit 37, and separates the stream data to extract the Merkel component, the Meissner component, and the Pacinian component of the tactile signal therefrom.

The Merkel component, Meissner component, and Pacinian component thus extracted are input to the bit addition units 52A-1, 52A-2, and 52A-3, and the quantization bit length thereof is converted into 12 bits by the lower bits addition, the upper and lower bits addition, and the upper bits addition, respectively.

The Merkel component and Meissner component that undergo the bit addition are subjected to an upsampling process with a sampling frequency=2000 Hz in the upsamplers 53A-1 and 53A-2, and the resultant is input to the band synthesis filter 54A.

Further, the Pacinian component that undergoes the bit addition is input to the band synthesis filter 54A with the sampling frequency maintained at 2000 Hz.

The band synthesis filter 54A synthesizes the input Merkel component, Meissner component, and Pacinian component to output the resultant to the post-processing unit 33 shown in FIG. 3.

Accordingly, the tactile presentation device 6 is driven on the basis of a tactile signal in which the Merkel component, the Meissner component, and the Pacinian component are synthesized.

1-6. Third Example

The bit rate of the second example described above is worse than that of the first example; however, the second example has an advantage that the tactile presentation device 6 can be provided for each receptor by encoding for each frequency band according to the receptor properties, as in the second example. In other words, the second example has an advantage of eliminating the need to use, as the tactile presentation device 6, a tactile presentation device having a wide frequency band for flatness.

Figure 16:
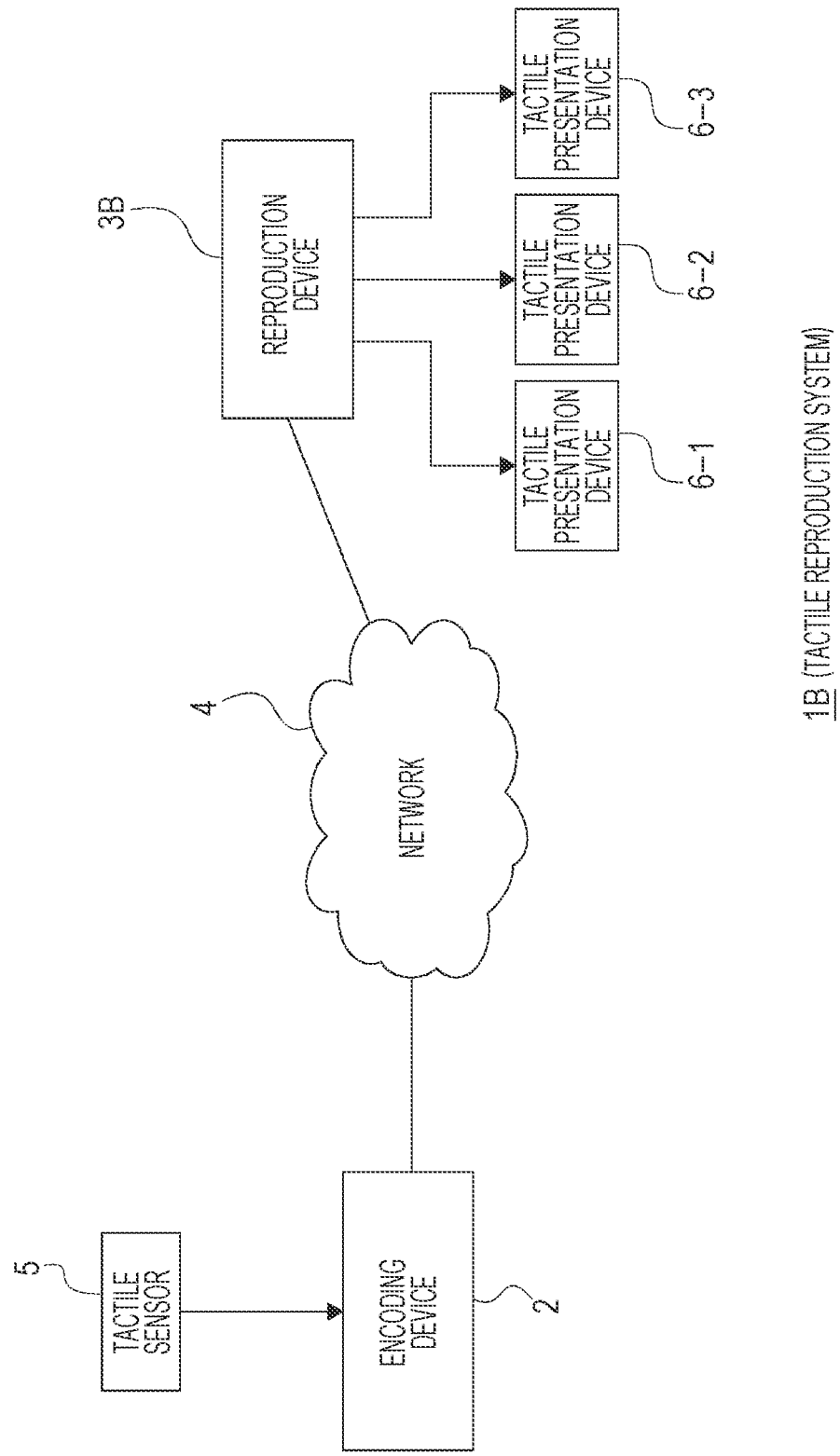
FIG. 16 is a diagram showing an example of the configuration of a tactile reproduction system according to a third example.

FIG. 16 is a diagram showing an example of the configuration of a tactile reproduction system 1B according to a third example.

Herein, an example is described in which the tactile presentation device 6 is provided for each receptor in the case of performing the encoding according to the second example.

As illustrated, the tactile reproduction system 1B is different from the tactile reproduction system 1 in that, as the tactile presentation device 6, a tactile presentation device 6-1, a tactile presentation device 6-2, and a tactile presentation device 6-3 are provided for each receptor and that a reproduction device 3B is provided instead of the reproduction device 3.

In this example, the tactile presentation device 6-1 is the tactile presentation device 6 corresponding to Merkel, the tactile presentation device 6-2 is the tactile presentation device 6 corresponding to Meissner, and the tactile presentation device 6-3 is the tactile presentation device 6 corresponding to Pacinian.

Figure 17:
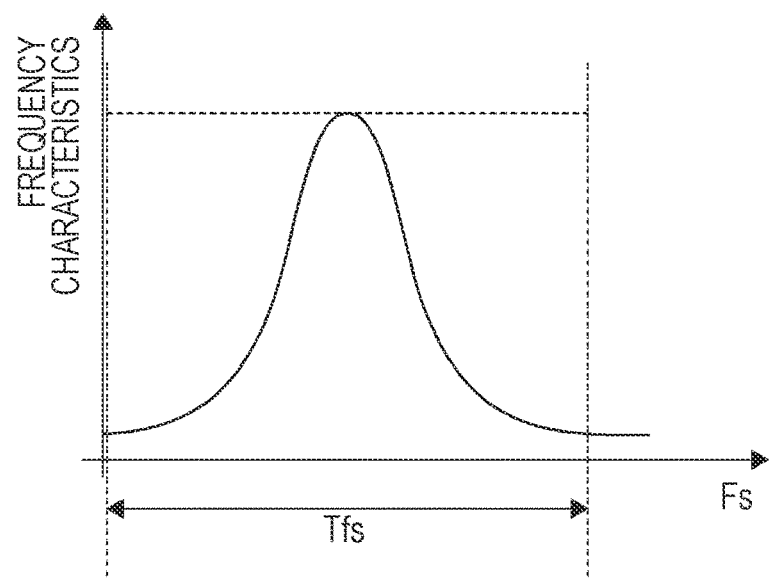
FIG. 17 is a diagram illustrating frequency characteristics of a vibration device.

Herein, the tactile presentation device 6 as the vibration device is assumed to generally have a problem with flatness of frequency characteristics. Specifically, FIG. 17 illustrates the frequency characteristics of a general vibration device with a frequency band targeted for digitization of a tactile signal (up to 1 kHz in this example) as a band Tfs; however, the frequency band in which the vibration device exhibits flatness generally tends to be narrower than the band Tfs.

Since there is a concern about reduction in reproducibility of a tactile sense due to such frequency characteristics of such a tactile presentation device 6, in the third example, the tactile presentation devices 6-1, 6-2, and 6-3 corresponding to the individual receptors are provided, and each of the tactile presentation devices 6 is driven on the basis of a tactile signal of the corresponding receptor.

Figure 18:
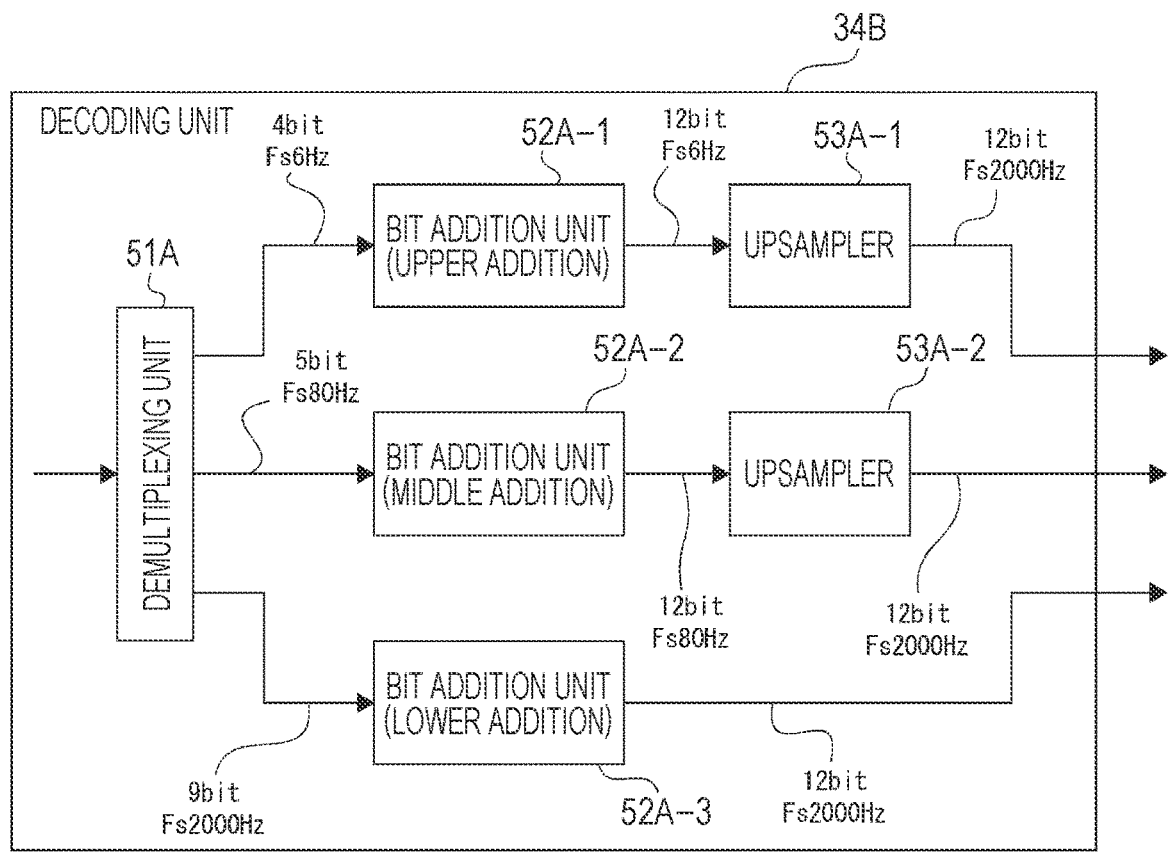
FIG. 18 is a diagram showing an example of the specific configuration of a decoding unit of a decoding device according to the third example.

The reproduction device 3B includes a decoding unit 34B shown in FIG. 18 instead of the decoding unit 34A (see FIG. 15) described in the second example.

As illustrated, the difference from the decoding unit 34A is that the band synthesis filter 54A is omitted, and the decoding unit 34B separately outputs, to the post-processing unit 33, the Merkel component, Meissner component, and Pacinian component decoded from the stream data.

Figure 19:
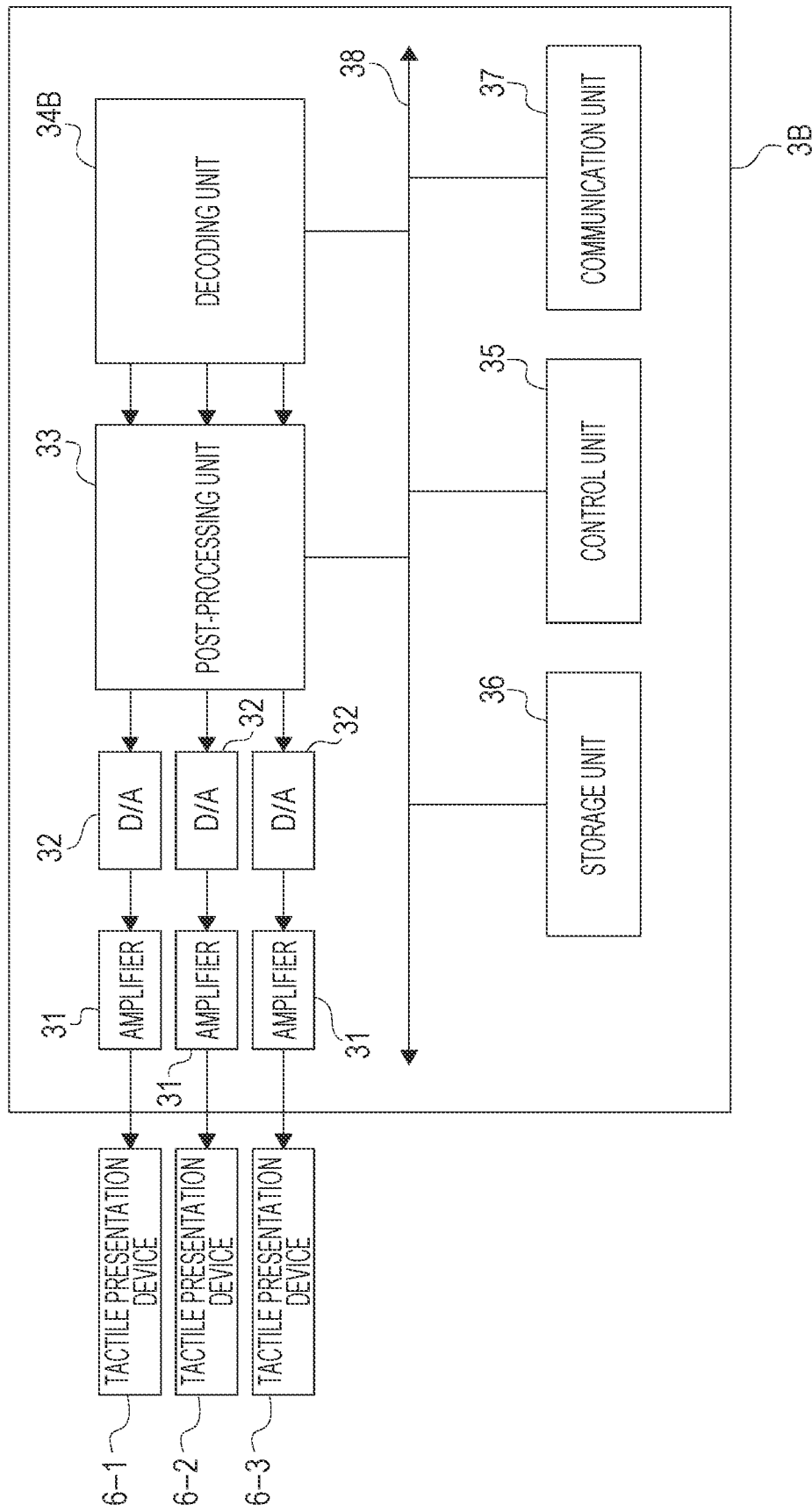
FIG. 19 is a diagram for explaining an example of the internal configuration of a decoding device according to the third example.

As shown in FIG. 19, in the reproduction device 3B, the D/A converter 32 and the amplifier 31 are provided for each tactile presentation device 6. The Merkel component, Meissner component, and Pacinian component outputted from the decoding unit 34B pass through the post-processing unit 33, are converted into analog signals by the corresponding D/A converter 32, are amplified by the corresponding amplifier 31, and then outputted to the corresponding tactile presentation device 6 of the tactile presentation devices 6-1, 6-2, and 6-3. Specifically, the Merkel component is outputted to the tactile presentation device 6-1, the Meissner component is outputted to the tactile presentation device 6-2, and the Pacinian component is outputted to the tactile presentation device 6-3.

Figure 20:
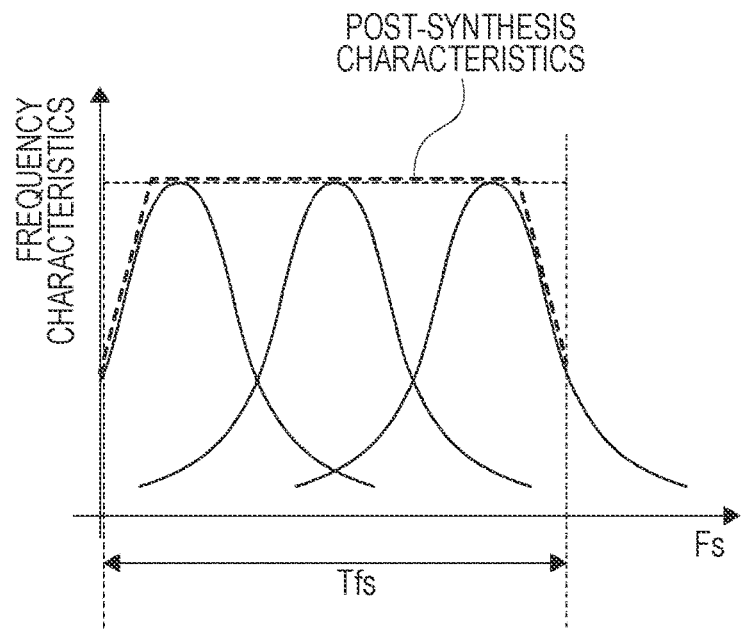
FIG. 20 is a diagram for explaining about an advantage of the third example.

FIG. 20 is a diagram for explaining about advantages for a case where the tactile presentation device 6 for each receptor is provided as in the third example.

According to the third example, providing the tactile presentation device 6 separately for each receptor makes it possible to, even if the flatness of the frequency characteristics of each of the tactile presentation devices 6 is low, expand the frequency band showing the flatness as a whole and to improve the flatness of the frequency characteristics. This is apparent from a comparison between the synthetic characteristics of the three tactile presentation devices 6 shown in FIG. 20 ("post-synthesis characteristics" in the diagram) and the characteristics shown in FIG. 17 earlier.

Accordingly, it is possible to prevent reduction in reproducibility of the tactile sense due to the frequency characteristics of the tactile presentation device 6.

Here, as the receptor properties, there is known a phenomenon that the tactile sensitivity changes depending on how much area is in contact with the vibration device.

Figure 21:
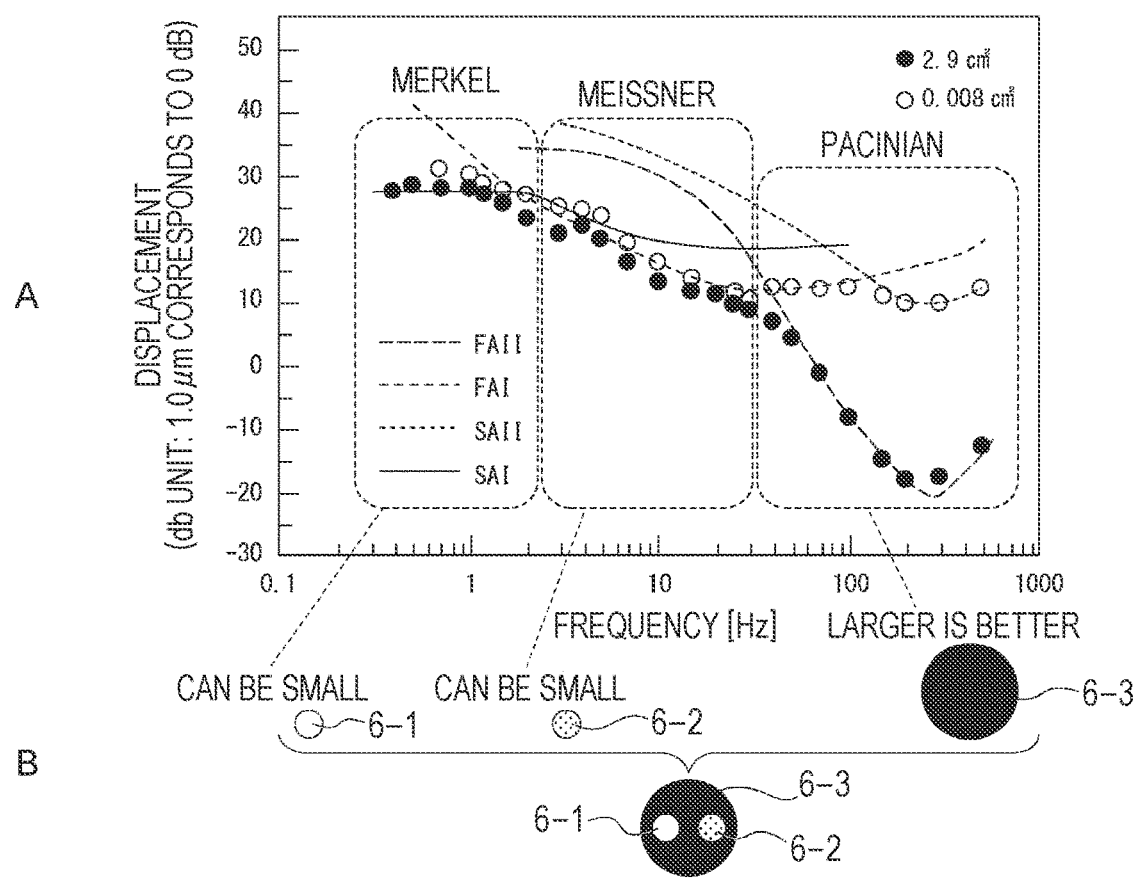
FIG. 21 is a diagram for explaining the size of a tactile presentation device provided for each receptor and a method for installing the tactile presentation device.

FIG. 21A illustrates a vibration threshold detection curve for two tactile presentation devices 6 (vibration devices) having different sizes. Specifically, in FIG. 21A, the result for a case where the size of one of the tactile presentation devices 6 is set to 2.9 cm^2 (^ means power), and the size of the other tactile presentation device 6 is set to 0.008 cm^2.

From FIG. 21A, it can be seen that, at 40 to 50 Hz or less, there is little difference in tactile sensitivity depending on the contact area of the tactile presentation device 6, but, in the frequency band equal to or higher than that, the tactile sensitivity changes significantly. This means that if the contact area is large, Pacinian is easy to fire, and if the contact area is small, Pacinian is less likely to fire, but that a human can perceive vibrations by increasing the amplitude to cause other receptors (Ruffini and Meissner) to fire, even if the contact area is small.

However, independently of the type of the vibration device, if an attempt is made to acquire a large amplitude at a high frequency, the energy required therefor increases rapidly. In some cases, the vibration device cannot be driven, or if it can be driven, the device may not be able to withstand the energy and may be broken. For this reason, in order to allow humans to perceive high-frequency vibrations, it is desirable to target Pacinian, which is easy to fire by increasing the contact area, even if the amplitude is small. In this example, the target receptor for high frequencies is supposed to be Pacinian.

In FIG. 21A, frequency bands corresponding to Merkel, Meissner and Pacinian are indicated by broken lines, and the diagram shows that the size of the tactile presentation device 6 may be small for Merkel and Meissner, and the size of the tactile presentation device 6 is preferably large for Pacinian.

Accordingly, the tactile presentation devices 6 having sizes according to the corresponding receptors are prepared in such a manner that the size of the tactile presentation device 6-1 (Merkel) and the size of the tactile presentation device 6-2 (Meissner) are small, and the size of the tactile presentation device 6-3 (Pacinian) is large, and the tactile presentation devices 6 are driven on the basis of a tactile signal encoded for each receptor.

As described above, it is difficult to acquire a large amplitude at a high frequency independently of the type of the vibration device; therefore, if the size of the tactile presentation device 6-3 especially for Pacinian is small, the reproducibility of high frequency tactile signals is probably reduced. The size of the tactile presentation device 6 is set as described above, which prevents such reduction in reproducibility.

Here, the receptors are present not separately for each part of the human body such as a fingertip, a palm, an arm, a face, and a foot for example, but mixed together in the same part of the human body; thus, it is not reasonable to place the vibration devices at different locations in specific parts of the human body. Therefore, vibration devices having an appropriate size for each receptor may be integrated, and configured as a single vibration device as an entity.

FIG. 21B shows an example in which the tactile presentation devices 6-1, 6-2, and 6-3 are integrally configured. In this example, the tactile presentation devices 6-1 and 6-2 are integrated into the tactile presentation device 6-3 having the largest size.

1-7. Fourth Example

The above description refers to a problem with the flatness of the frequency characteristics in the tactile presentation device 6, and the problem with the flatness of the frequency characteristics is true also for the tactile sensor 5 side.

Figure 22:
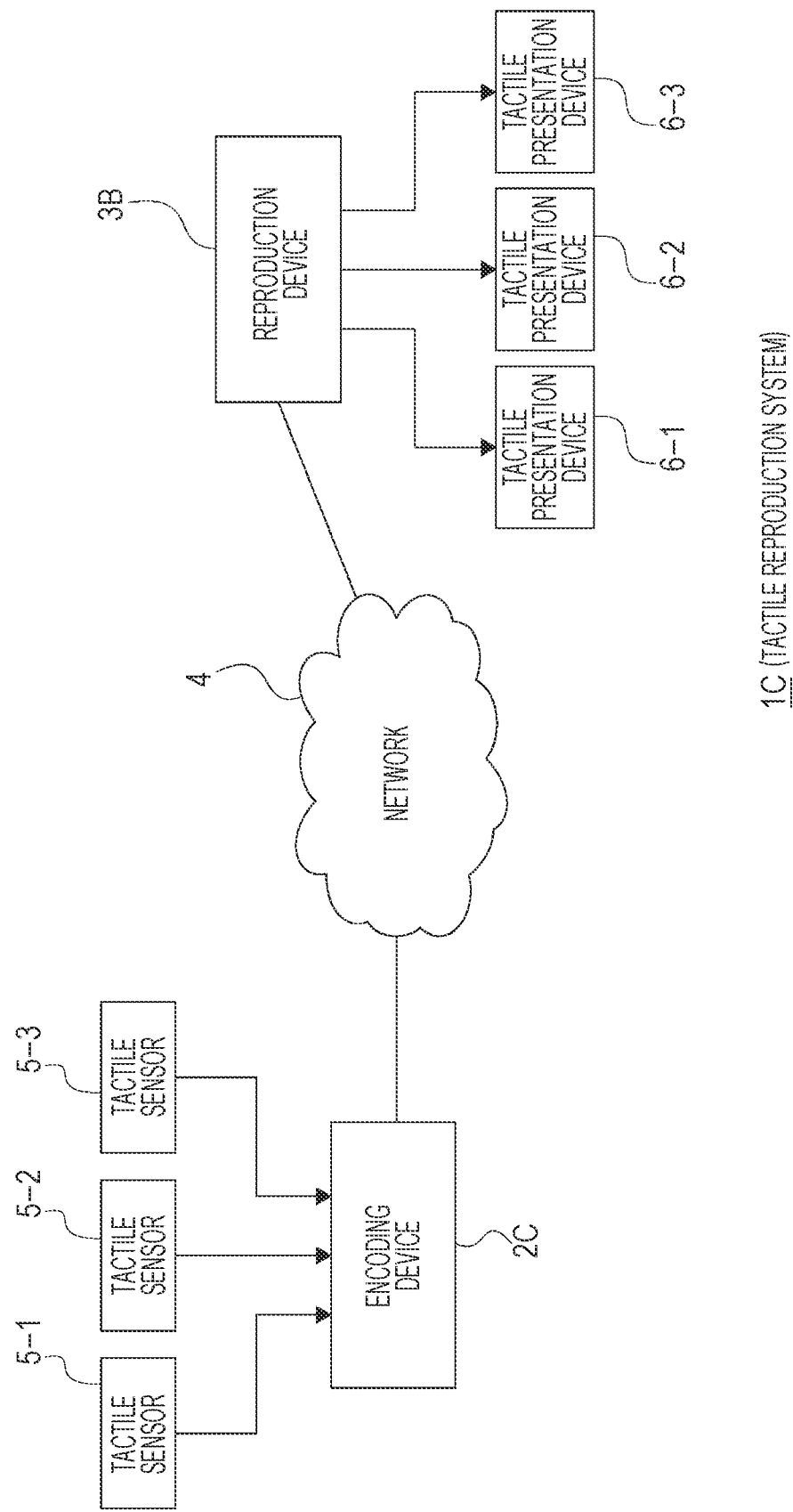
FIG. 22 is a diagram showing an example of the configuration of a tactile reproduction system according to a fourth example.

A tactile reproduction system 1C of the fourth example is intended to solve the problem with the flatness of the frequency characteristics on such a tactile sensor 5 side, and is provided with the plurality of tactile sensors 5 as shown in FIG. 22. Specifically, as the tactile sensors 5 in this case, a tactile sensor 5-1 corresponding to Merkel, a tactile sensor 5-2 corresponding to Meissner, and a tactile sensor 5-3 corresponding to Pacinian are provided.

In the tactile reproduction system 1C, instead of the encoding device 2 used in the second example and the third example, an encoding device 2C is provided which performs encoding on the basis of detection signals of the tactile sensors 5-1, 5-2, and 5-3.

Note that, in the tactile reproduction system 1C, a point that the reproduction device 3B and the tactile presentation devices 6-1, 6-2, and 6-3 are provided is similar to that in the third example.

Figure 23:
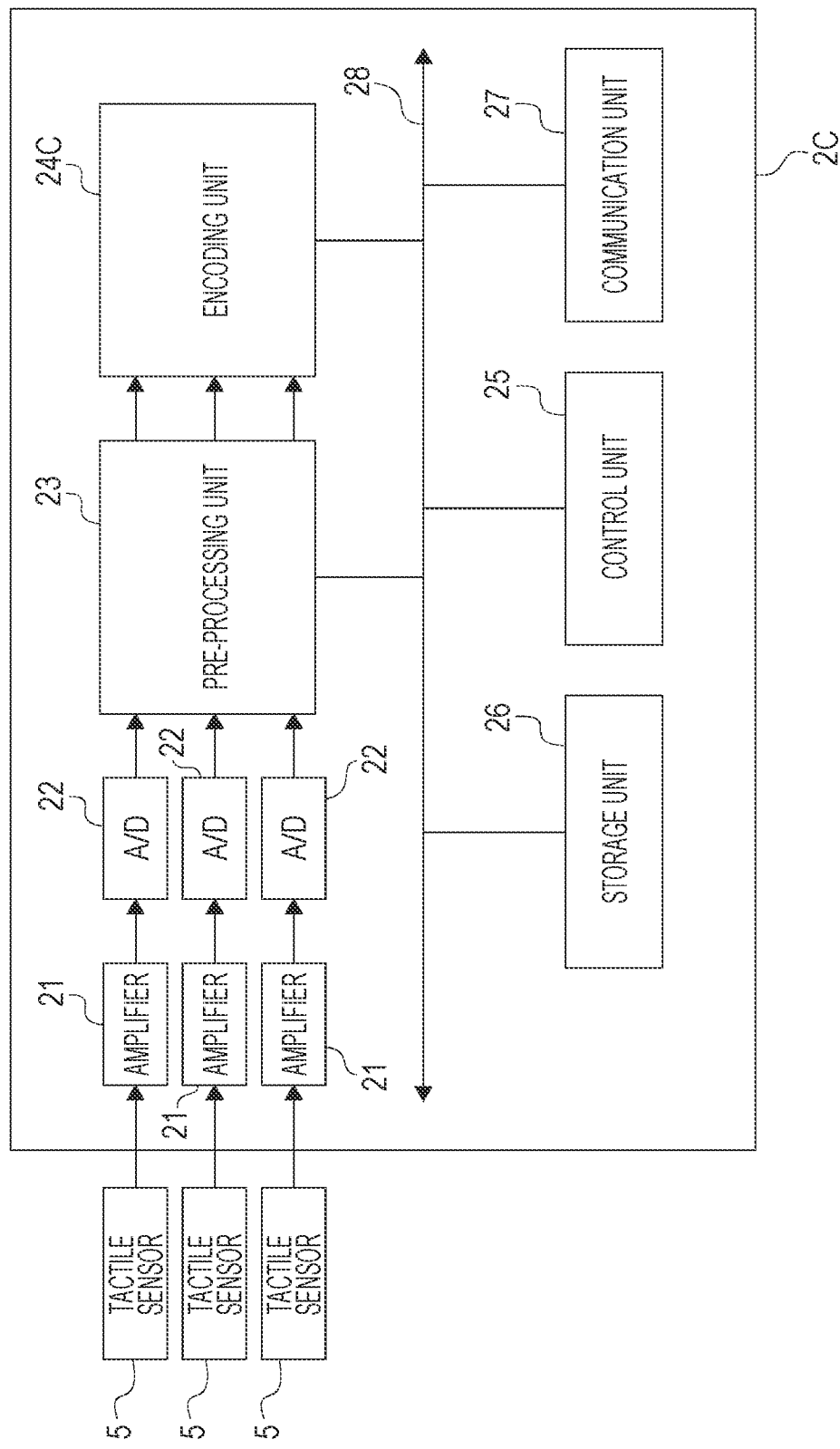
FIG. 23 is a diagram for explaining an example of the internal configuration of an encoding device according to the fourth example.

FIG. 23 is a diagram for explaining an example of the internal configuration of an encoding device 2C according to the fourth example.

Differences from the second example and the third example are that the amplifier 21 and the A/D converter 22 are provided for each tactile sensor 5 and that an encoding unit 24C is provided instead of the encoding unit 24A (see FIG. 14).

The detection signals of the tactile sensors 5-1, 5-2, and 5-3 are amplified by the corresponding amplifiers 21, converted into digital signals by the corresponding A/D converters 22, and then input to the encoding unit 24C individually via the pre-processing unit 23.

Figure 24:
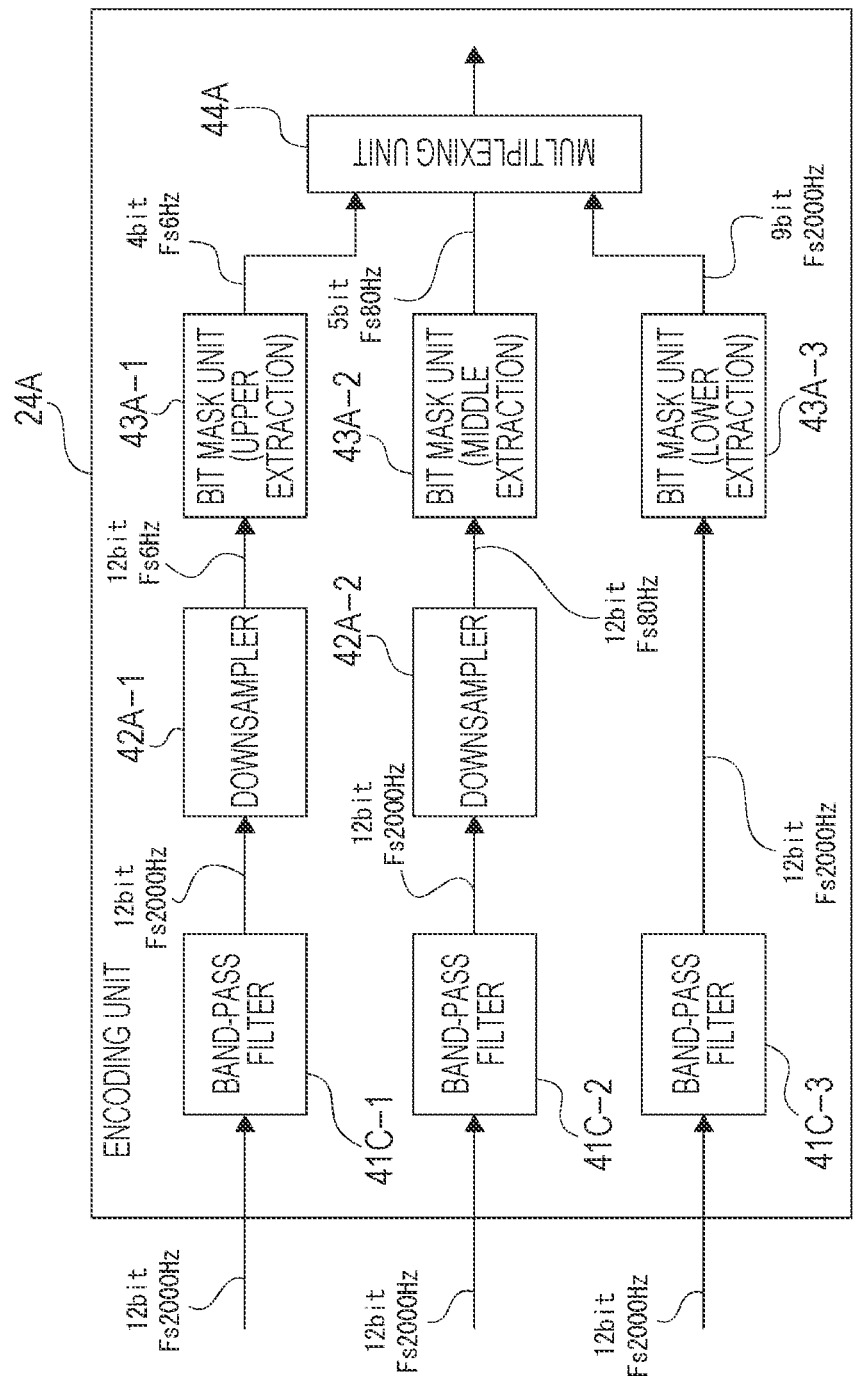
FIG. 24 is a diagram showing an example of the specific configuration of an encoding unit of an encoding device according to the fourth example.

FIG. 24 is a diagram showing an example of the specific configuration of an encoding unit 24C.

The encoding unit 24C is different from the encoding unit 24A shown in FIG. 14 in that a band-pass filter 41C-1, a band-pass filter 41C-2, and a band-pass filter 41C-3 are provided instead of the band-split filter 41A.

The band-pass filter 41C-1 receives, from the pre-processing unit 23, a tactile signal on the basis of a detection signal of the tactile sensor 5-1, extracts a component of a frequency band corresponding to Merkel illustrated in FIG. 13 to output the same to the downsampler 42A-1. The band-pass filter 41C-2 receives, from the pre-processing unit 23, a tactile signal on the basis of a detection signal of the tactile sensor 5-2, extracts a component of a frequency band corresponding to Meissner to output the same to the downsampler 42A-2.

The band-pass filter 41C-3 receives, from the pre-processing unit 23, a tactile signal on the basis of a detection signal of the tactile sensor 5-3, extracts a component of a frequency band corresponding to Pacinian to output the same to the bit mask unit 43A-3.

The encoding unit 24C allows for efficient encoding of a tactile signal for each receptor, corresponding to the case where the tactile sensor 5 is provided for each receptor, in a manner similar to that in the second example and the third example.

According to the fourth example described above, the tactile sensor 5 is separately provided for each receptor; thereby, even in a case where the flatness of the frequency characteristics of each of the tactile sensors 5 is low, the frequency band exhibiting the flatness can be expanded as a whole and the flatness of the frequency characteristics can be improved.

Accordingly, it is possible to prevent reduction in reproducibility of the tactile sense due to the frequency characteristics of the tactile sensor 5.

Further, in the fourth example, it is not essential to provide the band-pass filter 41C for each tactile sensor 5. Further, in the fourth example, since the A/D converter 22 is provided for each tactile sensor 5, the A/D converters 22 can set the sampling frequency and the quantization bit length of each of the tactile signals. From this point, it is not essential either to provide the downsampler 42A and the bit mask unit 43A.

Further, regarding to the tactile sensor 5, as with the tactile presentation device 6, the tactile sensor 5 for each receptor can be configured integrally.

Here, as for the third example and the fourth example, the frequency bands in which the individual receptors exhibit good tactile sensitivity are not clearly bounded but have a characteristic of overlapping each other.

Figure 25:
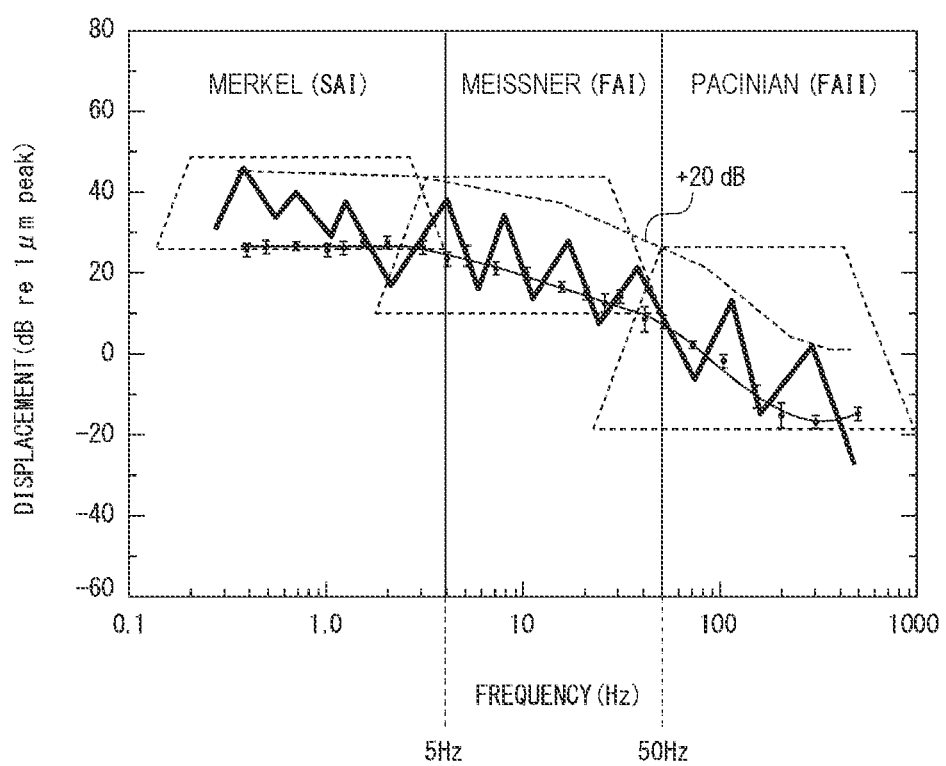
FIG. 25 is an explanatory diagram of a modification to band-split.
Figure 26:
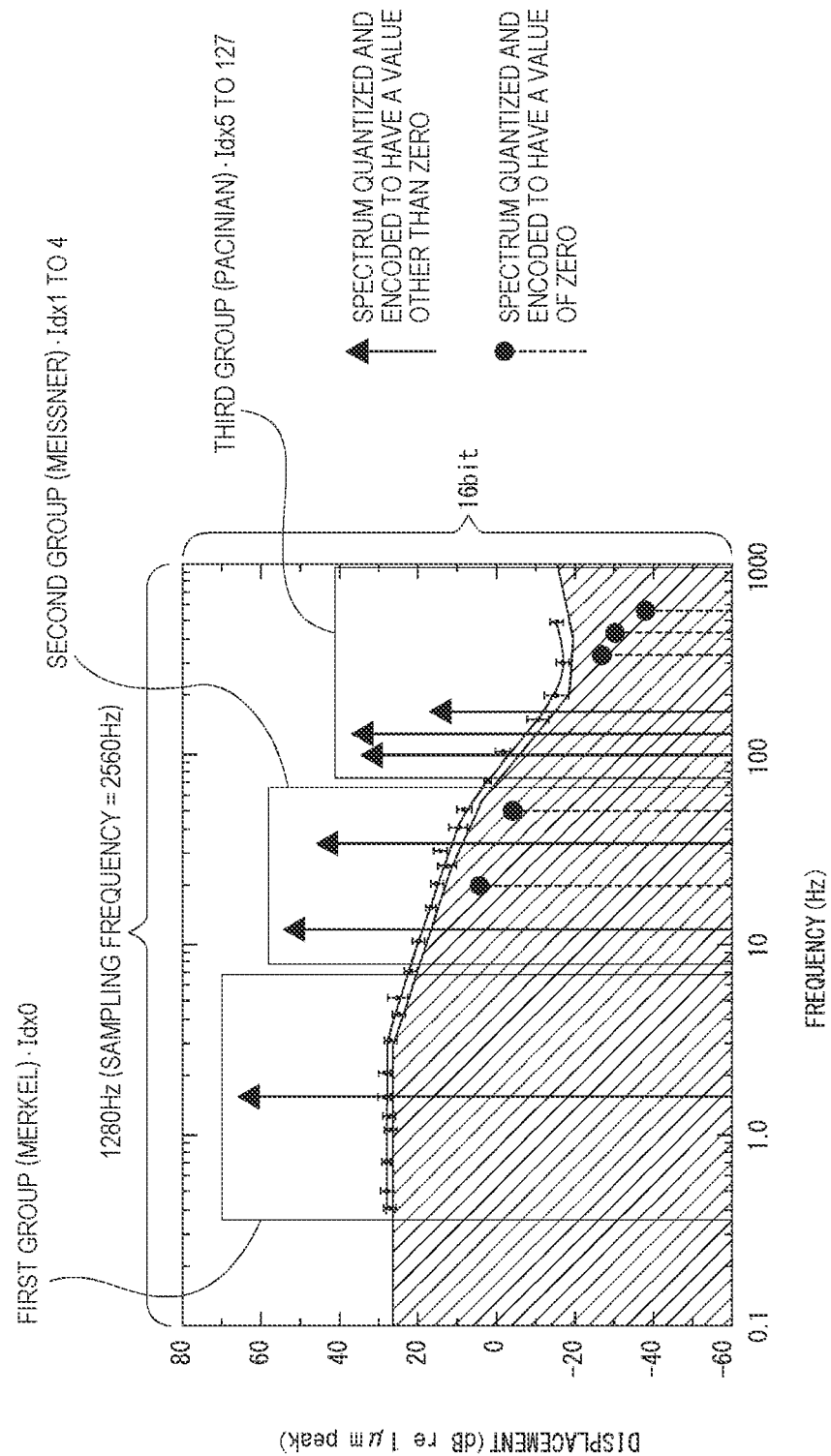
FIG. 26 is an explanatory diagram of an encoding method according to a second embodiment.

In consideration of this point, as for the band-split filter 41A and the band-pass filter 41C, the overlap characteristic can be reproduced by making cutoff characteristics gradual as shown in FIG. 25. In this case, the sampling frequency in the encoding is set to a value corresponding to the overlap characteristic. In other words, the bit rate of an encoded tactile signal can vary according to the overlap characteristic.

2. Second Embodiment

2-1. Encoding Method

Next, the second embodiment is described.

The encoding according to the first embodiment is performed on a tactile signal with an LPCM signal (time signal). In other words, the encoding for each frequency band is performed in a time domain.

However, as can be seen from the characteristic diagrams of FIG. 13 and so on, the properties of each receptor are observed and represented in a frequency domain.

In view of this, instead of splitting the time signal into bands to be handled as a frequency component, it is more efficient to convert the LPCM signal, which is a time signal, into a frequency component by orthogonal transform such as the discrete cosine transform (DCT) or the discrete Fourier transform (DFT) and then to encode the resultant.

An encoding method according to the second embodiment is described with reference to FIG. 27.

First, the upper limit of the frequency of a tactile signal to be reproduced is set to 1000 Hz+$\alpha$, and the sampling frequency is set to 2560 Hz for simplicity of explanation. Further, in the example described above, the dynamic range is set to 70 dB and the quantization bit length is set to 12 bits; however, for more general consideration, the quantization bit length is assumed to be 16 bits.

In encoding of this case, orthogonal transform is performed on a block basis, the block having a certain number of tactile signals (LPCM) per unit of time. The orthogonal transform includes DCT and DFT described above; however, an example of using modified DCT (MDCT), which is often used for encoding of audio signals, is taken herein because MDCT is more suitable than DCT and DFT because the tactile signal is a continuous one-dimensional signal.

Examples of encoding audio signals by using MDCT include MPEG audio layer 3 (MP3) and advanced audio coding (AAC). Since these techniques are widely used and are technically well known, the detailed description is omitted, and MDCT has an advantage of reducing discontinuous distortions during encoding by providing an overlap section between blocks.

Assuming that the number of LPCM samples included in a block of MDCT is N, 2N samples, obtained by combining the two of them together, are converted orthogonally to obtain N frequency components. This frequency component is called a spectrum. In other words, N spectra are obtained for every N LPCMs.

Specifically, in the orthogonal transform of this case, 128 samples of LPCM are input, and a conversion to a spectrum is performed when 256 samples are collected. Although 128 spectra are generated, the frequency width (resolution) of one spectrum is 10 Hz because the entire frequency band is 1280 Hz from the sampling frequency (2560 Hz).

In this case, indices Idx=0 to 127 are assigned to the spectrum in order from the low frequency side.

Next, these spectra are grouped. The grouping of this case is grouping according to the properties of the receptors. Specifically, according to the frequency characteristics of the Merkel, Meissner, and Pacinian receptors, the spectra are assigned to three groups: a first group as the Merkel group, a second group as the Meissner group, and a third group as the Pacinian group.

First, Merkel is responsible for frequencies up to a few Hz, but since the resolution is 10 Hz as described above, one index Idx is assigned to the first group. In other words, a spectrum with index Idx=0 on the lowest frequency side is assigned thereto.

Next, Meissner is responsible for frequencies of approximately 10 Hz to 50 Hz, and a spectrum of indices Idx1 to Idx4 is assigned to the second group.

Further, Pacinian is responsible for frequencies equal to or higher than that of Meissner, and a spectrum of indices Idx5 to Idx127 is assigned to the third group.

In the following description, each of these groups is referred to as a "band".

Then, for each band, the spectrum is normalized on the basis of the maximum value of the corresponding band. A factor used for normalization (hereinafter referred to as a "normalization factor") is an indexed factor that is evenly (or may be unevenly also) divided in advance between the maximum value that can be represented as a system and the vibration detection threshold curve. In other words, instead of encoding the entire spectrum, a section from the lowest value that can be perceived by humans to the maximum value that can be represented by the system is to be encoded.

Further, the normalized spectrum is quantized.

In quantization, a large number of quantization steps is given to a spectrum having a large band gain, and a small number of quantization steps is given to a spectrum having a small band gain. In other words, the accuracy of a band with a large gain is increased and the accuracy of a band with a small gain is reduced. Note that the magnitude of the gain herein can be described as the size of a section from the vibration detection threshold to the maximum value that can be represented by the system.

Then, in the quantization of this case, if the band is equal to or smaller than the vibration detection threshold, the band itself is discarded without quantization (not to be encoded). In this way, it is possible to effectively reduce the bit rate of a tactile signal by discarding components equal to or smaller than the threshold, in other words, without performing quantization or encoding.

Further, by setting the number of quantization steps for each band as described above, quantization with different number of quantization steps between at least a part of the bands (between frequency bands). Specifically, in this example, the number of quantization steps of a band with a small gain is set to be smaller than the number of quantization steps of a band with a large gain. This reduces the bit rate.

Next, entropy encoding is performed on a quantized spectrum.

Specifically, the frequency of appearance of the quantized spectrum is checked in advance, and a short code length is assigned to a quantized spectrum appearing more frequently and a long code length is assigned to a quantized spectrum appearing less frequently. Note that examples of the entropy encoding include Huffman encoding. Specifically, in a case where the frequency of appearance of a spectrum (having a value of zero) equal to or smaller than the vibration detection threshold is high and the frequency of appearance of the other spectra (having values other than zero) is low, a short code length is assigned to the former, which enables efficient encoding.

By performing encoding in the frequency domain as described above, the bit rate of the tactile signal can be effectively reduced. In particular, the encoding method described above enables the bit rate to be effectively reduced in terms of discarding components equal to or smaller than the vibration detection threshold and in terms of applying entropy encoding.

2-2. Encoding-Side Configuration

Figure 27:
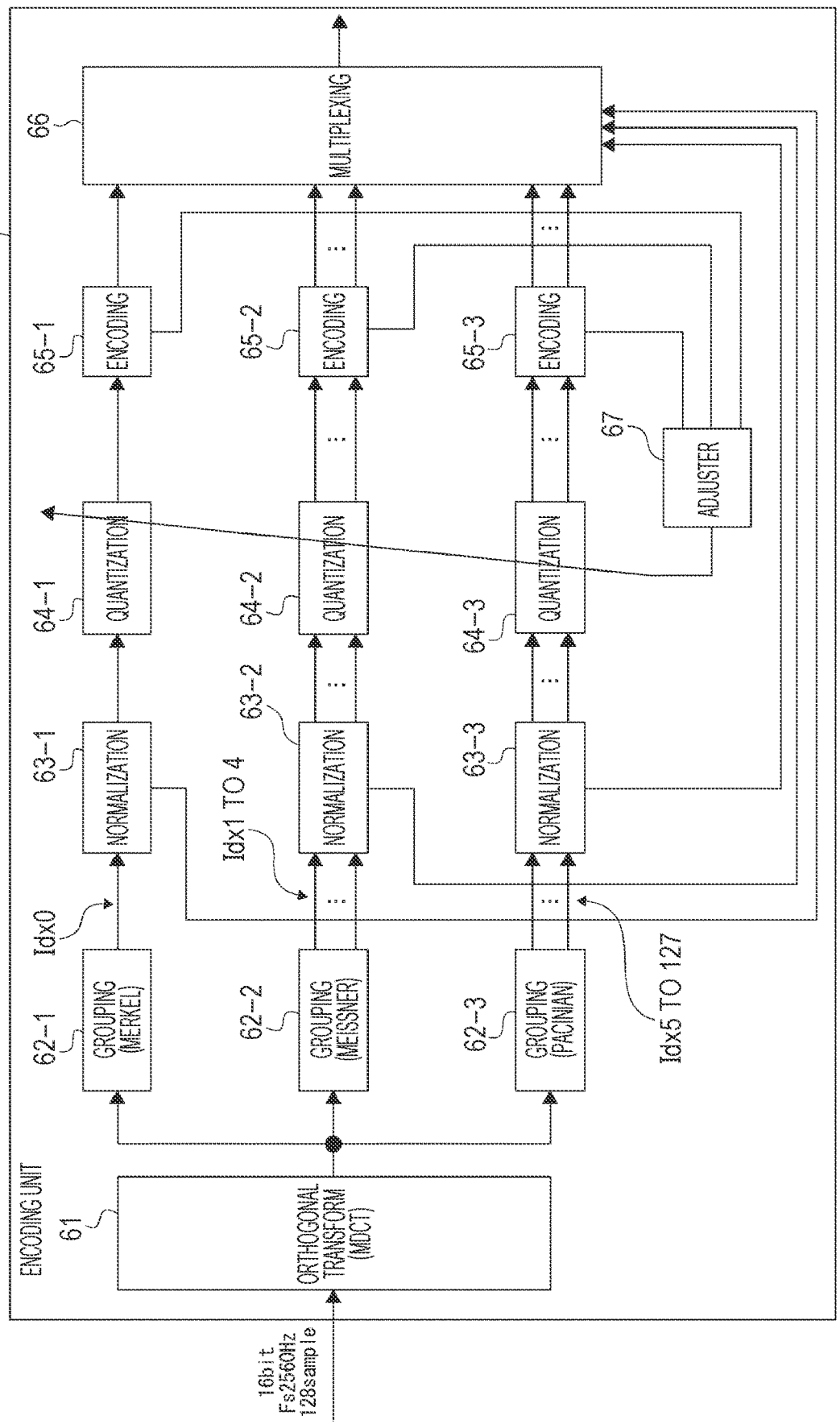
FIG. 27 is a diagram showing an example of the specific configuration of an encoding unit for implementing an encoding method according to the second embodiment.

FIG. 27 shows an example of the specific configuration of an encoding unit 24D for implementing an encoding method according to the second embodiment.

Note that, herein, a configuration is described which corresponds to a case where only one type of the tactile sensor 5 is used as in the second example and the third example of the first embodiment described above. In other words, the configuration of the encoding device 2 in this case is similar to the configuration shown in FIG. 2 except that an encoding unit 24D is provided instead of the encoding unit 24A.

In FIG. 27, the encoding unit 24D includes an orthogonal transformation unit 61 and a multiplexing unit 66, and includes, for each receptor, a grouping unit 62, a normalization unit 63, a quantization unit 64, and an encoding unit 65. The grouping unit 62, the normalization unit 63, the quantization unit 64, and the encoding unit 65 are distinguished from one another by the suffix "-1" at the end for those corresponding to Merkel, the suffix "-2" at the end for those corresponding to Meissner, and the suffix "-3" at the end for those corresponding to Pacinian.

The orthogonal transformation unit 61 performs orthogonal transform by MDCT on a tactile signal input from the pre-processing unit 23. In this example, a tactile signal having a sampling frequency=2560 Hz and a quantization bit length=16 bits is input every 128 samples, and the orthogonal transformation unit 61 generates 128 spectra when 256 samples of the tactile signal are collected.

Data on the spectra obtained by the orthogonal transformation unit 61 is input to grouping units 62-1, 62-2, and 62-3. The grouping unit 62-1 performs grouping of the first group described above, and outputs a spectrum of the index Idx=0 to the normalization unit 63-1.

The grouping unit 62-2 performs grouping of the second group described above, and outputs a spectrum of the index Idx=1 to 4 to the normalization unit 63-2.

The grouping unit 62-3 performs grouping of the third group described above, and outputs a spectrum of the index Idx=5 to 127 to the normalization unit 63-3.

Each of the normalization units 63 normalizes the input spectrum on the basis of the normalization factor described above (normalization factor for each band).

Further, each of the normalization units 63 outputs a normalization factor for each band to the multiplexing unit 66.

The quantization units 64-1, 64-2, and 64-3 quantize the spectra normalized by the normalization units 63 having the same sign at the end as that of the quantization units 64-1, 64-2, and 64-3, respectively.

As described above, in quantization, a large number of quantization steps is given to a spectrum having a large band gain, and a small number of quantization steps is given to a spectrum having a small band gain. Further, if the band is equal to or smaller than the vibration detection threshold, the band itself is not encoded.

The encoding units 65-1, 65-2, and 65-3 perform entropy encoding on the spectrum quantized by the quantization unit 64 having the same sign at the end respectively, and output the resultant to the multiplexing unit 66.

The multiplexing unit 66 multiplexes data on the spectrum encoded by the encoding units 65-1, 65-2, and 65-3 to generate stream data. At this time, the multiplexing unit 66 stores, for the stream header or the frame header, the normalization factor for each band input from the normalization units 63-1, 63-2, and 63-3.

Here, it is possible that if the normalization factor has a specific value (for example, equal to or smaller than the vibration detection threshold), the spectrum of the band is not encoded to switch whether or not to encode the band itself.

Note that, in the configuration of the encoding unit 24D described above, the bit rate reduction of the tactile signal is not guaranteed to be constant because the bit rate reduction depends on the characteristics of the signal.

In a case where there is a request to set the bit rate at a constant value, a configuration is possible in which an adjuster 67 is provided as shown in the diagram, and the quantization by each of the quantization units 64 and the encoding by each of the encoding units 65 are repeated until a predetermined bit rate is achieved. Specifically, the adjuster 67 inputs the encoded data from each of the encoding units 65 to calculate a bit rate, and changes the quantization parameter (e.g., the number of quantization steps) in each of the quantization units 64-1 until the calculated bit rate matches the predetermined bit rate. At this time, the number of quantization steps sometimes become not only smaller than the initial value but also larger than the initial value, depending on the setting of the initial value of the number of quantization steps.

Note that, in a case where the tactile sensor 5 is provided for each receptor as in the fourth example of the first embodiment, a configuration is only required in which the encoding unit 24D performs orthogonal transform on each of the tactile signals, for each tactile sensor 5, input from the pre-processing unit 23, and inputs the resultant individually to the grouping units 62-1, 62-2, and 62-3.

2-3. Decoding-Side Configuration

Figure 28:
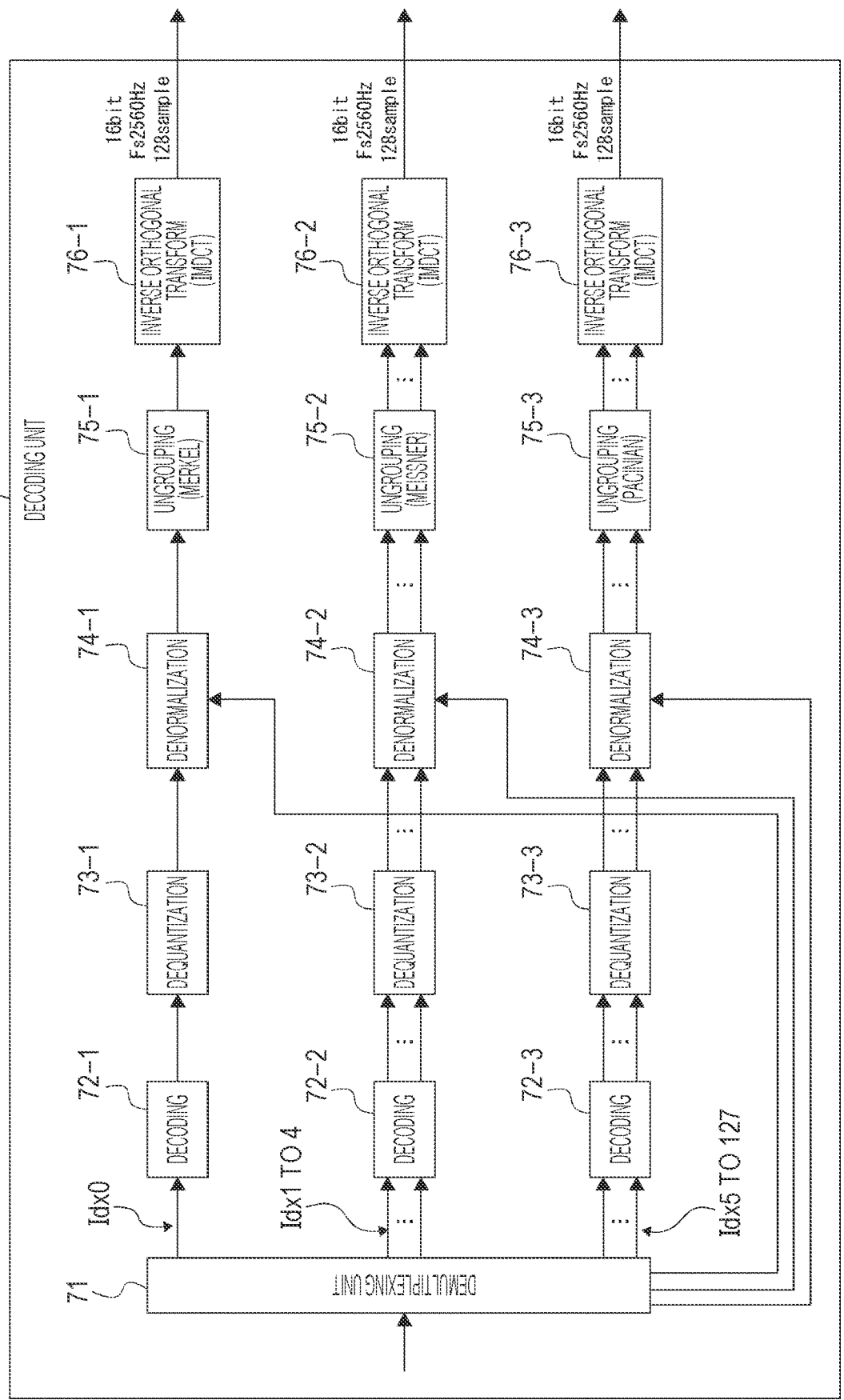
FIG. 28 is a diagram showing an example of the specific configuration of a decoding unit according to the second embodiment.

FIG. 28 shows an example of a specific configuration of a decoding unit 34D according to the second embodiment for decoding the tactile signal encoded by the encoding unit 24D shown in FIG. 27.

Here, description is given of a configuration corresponding to a case where the tactile presentation device 6 is provided for each receptor as in the third example and the fourth example of the first embodiment described above. In other words, the configuration of the reproduction device 3B in this case is similar to the configuration shown in FIG. 19 except that the decoding unit 34D is provided instead of the decoding unit 34B.

In FIG. 28, the decoding unit 34D includes a demultiplexing unit 71, and includes, for each receptor, a decoding unit 72, a dequantization unit 73, a denormalization unit 74, an ungrouping unit 75, and an inverse orthogonal transformation unit 76. The decoding unit 72, the dequantization unit 73, the denormalization unit 74, the ungrouping unit 75, and the inverse orthogonal transformation unit 76 are distinguished from one another by the suffix "-1" at the end for those corresponding to Merkel, the suffix "-2" at the end for those corresponding to Meissner, and the suffix "-3" at the end for those corresponding to Pacinian.

The demultiplexing unit 71 receives stream data of the tactile signal generated by the multiplexing unit 66 shown in FIG. 27, and performs demultiplexing processing. By this separation processing, the spectral data in a state of being entropy-encoded is separated and extracted from the stream data.

Further, in this example, the demultiplexing unit 71 acquires a normalization factor for each band included in the stream data.

Here, it is possible that if the normalization factor has a specific value (for example, equal to or smaller than the vibration detection threshold), the spectrum of the band is determined not to be encoded, and the separation and extraction of the spectral data is not performed.

The decoding units 72-1, 72-2, and 72-3 receive, from the demultiplexing units 71, the spectral data of the corresponding group from the first to third groups to decode the entropy encoding, and outputs the resultant to the dequantization unit 73 having the same sign at the end as that of the dequantization units 73-1, 73-2, and 73-3.

The dequantization units 73-1, 73-2, and 73-3 perform dequantization on the spectral data decoded by the corresponding decoding unit 72, and output the resultant to the denormalization unit 74 having the same sign at the end as thereof among the denormalization units 74-1, 74-2, and 74-3.

The denormalization units 74-1, 74-2, and 74-3 denormalize the spectral data dequantized by the corresponding dequantization unit 73, and output the resultant to the ungrouping unit 75 having the same sign at the end as thereof among the ungrouping units 75-1, 75-2, and 75-3. At this time, each of the denormalization units 74 performs denormalization using the normalization factor obtained by the demultiplexing unit 71.

The ungrouping units 75-1, 75-2, and 75-3 perform predetermined processing for ungrouping the spectral data denormalized by the corresponding denormalization unit 74, and output the resultant to the inverse orthogonal transformation unit 76 having the same sign at the end as thereof among the inverse orthogonal transformation units 76-1, 76-2, and 76-3.

The inverse orthogonal transformation units 76-1, 76-2, and 76-3 perform an inverse orthogonal transform (IMDCT) on the spectral data input from the corresponding ungrouping unit 75 to obtain a tactile signal as a time signal (LPCM).

The decoding unit 34D as described above can decode appropriately the tactile signal, encoded in the frequency domain.

Figure 29:
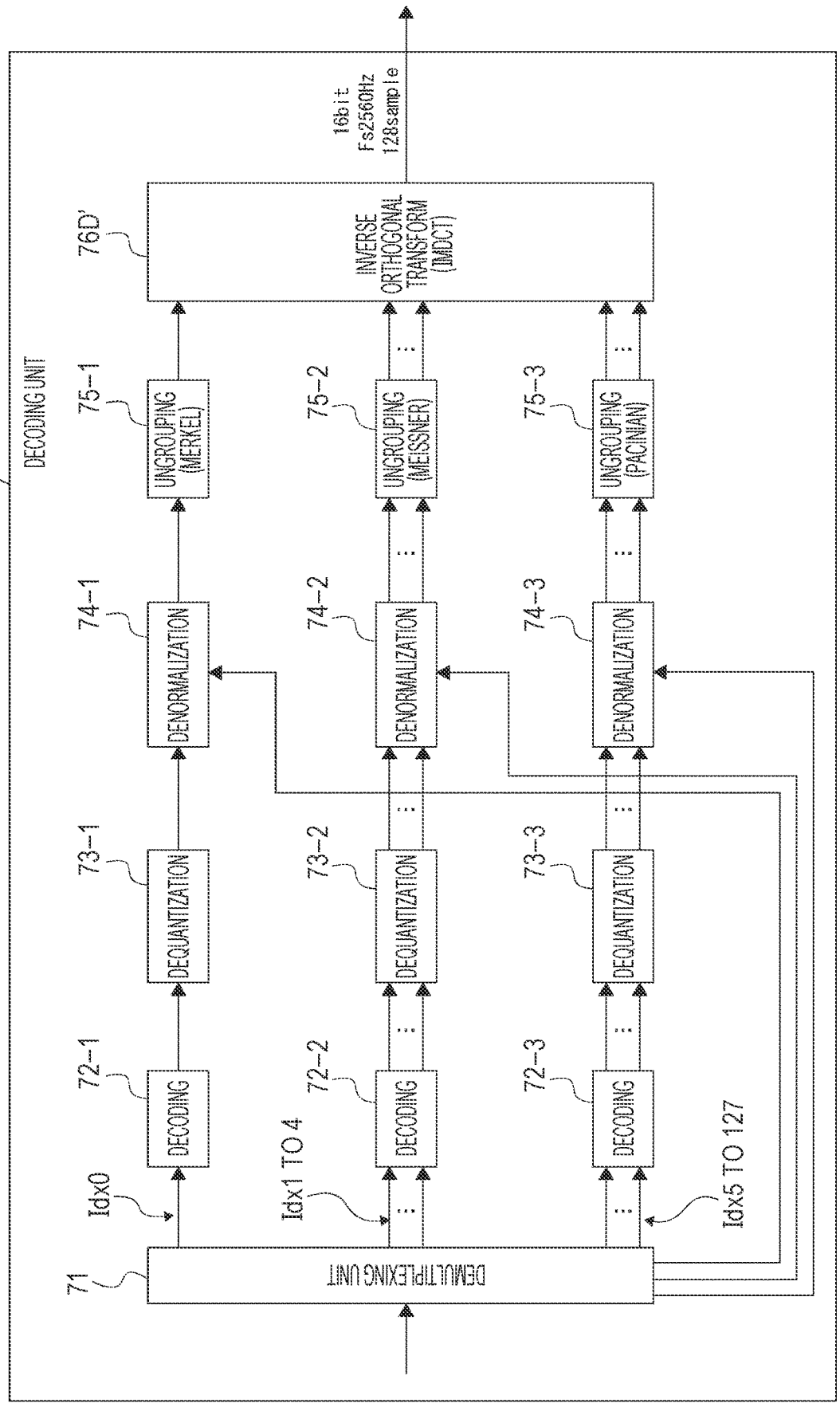
FIG. 29 is a diagram showing an example of another configuration of a decoding unit according to the second embodiment.

Note that, in a case where only one type of the tactile presentation device 6 is used as in the first example and the second example of the first embodiment, a configuration is only required in which the spectral data from the ungrouping units 75-1, 75-2, and 75-3 is input to a single inverse orthogonal transformation unit 76D', such as a decoding unit 34D' shown in FIG. 29.

3. Modification to Embodiments

The foregoing description takes an example in which the reproduction device 3 (or 3B) acquires an encoded tactile signal via the network 4; however, for example, another method is possible for acquiring a tactile signal according to a method other than communication, such as by recording an encoded tactile signal on a portable recording medium and causing the reproduction device 3 (or 3B) to acquire the tactile signal via the recording medium.

Further, the various values presented so far, such as the sampling frequency and the quantization bit length of a tactile signal, the number of blocks in the orthogonal transform, the number of spectra, the number of groups (bands) in the frequency domain, etc., are examples for explanation only and are not limited to the presented values. Further, in the second embodiment, the grouping in the frequency domain is not limited to grouping on a band basis, and grouping is possible in the band in smaller units.

4. Summary of Embodiments

As described above, the decoding device (reproduction device 3 or 3B) according to the embodiment includes an acquisition unit (acquisition processing unit F1, communication unit 37) for acquiring a tactile signal encoded for each frequency band, and a decoding unit (decoding processing unit F2, decoding units 34, 34A, 34B, 34D, and 34D') for decoding the tactile signal acquired by the acquisition unit.

This enables efficient encoding in which bit distribution for a tactile signal which is difficult for humans to perceive due to the tactile properties is reduced.

Therefore, it is possible to reduce the amount of data for a tactile signal while tactile reproducibility is ensured, and to improve the efficiency of a tactile reproduction system.

Further, in the decoding device according to the embodiment, the acquisition unit acquires, as the tactile signal, a signal on the basis of a detection signal of the tactile sensor (5, 5-1, 5-2, and 5-3).

Accordingly, it is possible to perform tactile reproduction on the basis of a tactile signal actually sensed.

Thus, the reproducibility of a tactile sense can be enhanced.

Further, in the decoding device according to the embodiment, the acquisition unit acquires the tactile signal encoded for each frequency band according to the properties of the receptor.

This enables efficient encoding that reduces bit distribution for a tactile signal which is difficult for humans to perceive in terms of difference in properties of each receptor.

Therefore, it is possible to reduce the amount of data for a tactile signal while tactile reproducibility is ensured, and to improve the efficiency of a tactile reproduction system.

Furthermore, in the decoding device according to the embodiment, the acquisition unit acquires a tactile signal encoded for each frequency band in a time domain (see the first embodiment).

This eliminates the need to perform orthogonal transform on a tactile signal in order to realize efficient encoding that reduces bit distribution for a tactile signal which is difficult for humans to perceive.

Therefore, it is possible to simplify the configuration and reduce the processing load in realizing the encoding and decoding of the tactile signal.

Further, in the decoding device according to the embodiment, the acquisition unit acquires a tactile signal on which processing for reducing the quantization bit length has been performed.

This makes it possible to reduce the quantization bit length or to lower the sampling frequency for a tactile signal in at least one frequency band, leading to the reduction in amount of data for the tactile signal.

Thus, the efficiency of the tactile reproduction system can be improved.

Further, in the decoding device according to the embodiment, the acquisition unit acquires a tactile signal that has been encoded for each frequency band in a frequency domain after the orthogonal transform (see the second embodiment).

Accordingly, the degree of freedom for bit reduction according to the frequency is improved, which allows for more efficient encoding.

Thus, the efficiency of the tactile reproduction system can be further improved.

Furthermore, in the decoding device according to the embodiment, the acquisition unit acquires a tactile signal that has been encoded, as the encoding for each frequency band, to exclude a tactile signal component smaller than a predetermined amplitude threshold from the quantization target.

Accordingly, it is possible to perform encoding for excluding, from the target for quantization, a tactile signal component which is difficult for humans to perceive in terms of signal amplitude value.

Therefore, it is possible to implement efficient encoding in which bit distribution is reduced for a tactile signal which is difficult for humans to perceive, and to reduce the amount of data of the tactile signal while the reproducibility of a tactile sense is ensured.

Further, in the decoding device according to the embodiment, the acquisition unit acquires a tactile signal that has been quantized by a different number of quantization steps between at least a part of the frequency bands.

This makes it possible to reduce the number of quantization steps for a part of the frequency bands as compared to the other frequency bands.

Thus, the amount of data for the tactile signal can be reduced.

Further, in the decoding device according to the embodiment, the acquisition unit acquires an entropy-encoded tactile signal.

Accordingly, it is possible to perform efficient encoding by reducing the amount of encoding for a symbol appearing frequently.

Thus, the efficiency of the tactile reproduction system can be further improved.

Furthermore, in the decoding device according to the embodiment, the decoding unit (decoding unit 34B, 34D) individually output a decoded tactile signal for each frequency band.

Accordingly, it is possible to perform tactile reproduction by using different tactile presentation devices for each receptor.

Therefore, it is possible to prevent reduction in reproducibility of the tactile sense due to the use of the tactile presentation device having low flatness of the frequency characteristics.

Further, in the decoding device according to the embodiment, the acquisition unit acquires a plurality of tactile signals acquired by encoding frequency bands corresponding to detection signals of the plurality of tactile sensors (see the fourth example of the first embodiment). Specifically, in the embodiment, a tactile signal of each of the Merkel component, the Meissner component, and the Pacinian component obtained by encoding the detection signals of the tactile sensors 5-1, 5-2, and 5-3 is acquired.

Accordingly, it is possible to perform tactile reproduction by using different tactile sensors for each receptor.

Therefore, it is possible to prevent reduction in reproducibility of the tactile sense due to the use of the tactile sensor having low flatness of the frequency characteristics.

Further, a decoding method according to the present embodiment is a decoding method including decoding a tactile signal encoded for each of frequency bands.

In the decoding method according to such an embodiment, operation and effect similar to those of the decoding device according to the embodiment described above can be obtained.

Herein, the functions of the encoding units (24, 24A, 24C, 24D) and the decoding units (34, 34A, 34B, 34D, 34D') described above can be implemented as software processing by a CPU or the like. The software processing is executed on the basis of a program, and the program is stored in a storage device that can be read by a computer device (information processing device) such as a CPU.

The program according to the present embodiment is a program that causes an information processing device to implement a function of decoding a tactile signal encoded for each frequency band.

With such a program, the decoding device according to the first and second embodiments described above can be implemented.

Further, the effects described in the present specification are only examples and are not limitative ones, and there may be other effects.

5. Present Technology

Additionally, the present technology may also be configured as below.

(1)

A decoding device including:

a decoding unit configured to decode a tactile signal encoded for each of frequency bands.

(2)

The decoding device according to (1), in which the encoded tactile signal includes a tactile signal on the basis of a detection signal of a tactile sensor.

(3)

The decoding device according to (1) or (2), in which the encoded tactile signal includes a tactile signal encoded for each of the frequency bands according to properties of a receptor.

(4)

The decoding device according to any one of (1) to (3), in which the encoded tactile signal includes a tactile signal encoded for each of the frequency bands in a time domain after band-split.

(5)

The decoding device according to (4), in which the encoded tactile signal is different, between at least a part of the frequency bands, in at least one of quantization bit length or a sampling frequency.

(6)

The decoding device according to any one of (1) to (3), in which the encoded tactile signal includes a tactile signal encoded for each of the frequency bands in a frequency domain after orthogonal transform.

(7)

The decoding device according to (6), in which the encoded tactile signal includes a tactile signal encoded with a tactile signal component smaller than a predetermined amplitude threshold excluded from a target for quantization and encoding.

(8)

The decoding device according to (6) or (7), in which the encoded tactile signal includes a tactile signal encoded by quantization with numbers of quantization steps different between at least a part of the frequency bands.

(9)

The decoding device according to any one of (6) to (8), in which the encoded tactile signal includes an entropy-encoded tactile signal.

(10)

The decoding device according to any one of (1) to (9), in which the decoding unit individually outputs the decoded tactile signal for each of the frequency bands.

(11)

The decoding device according to any one of (1) to (10), in which the encoded tactile signal includes a plurality of tactile signals acquired by encoding frequency bands corresponding to a detection signal of a plurality of tactile sensors.

REFERENCE SIGNS LIST 1, 1B, 1C Tactile reproduction system
2, 2C Encoding device
3, 3B Reproduction device
5, 5-1, 5-2, 5-3 Tactile sensor
6, 6-1, 6-2, 6-3 Tactile presentation device
24, 24A, 24C, 24D Encoding unit
27 Communication unit
34, 34A, 34B, 34D, 34D' Decoding unit
37 Communication unit
F1 Acquisition unit
F2 Decoding unit
41, 41A Band-split filter
41C-1, 41C-2, 41C-4 Band-pass filter
42, 42A-1, 42A-2 Downsampler
43-1, 43-2, 43A-1, 43A-2, 43A-3 Bit mask unit
44, 44A, 66 Multiplexing unit
51, 51A, 71 Demultiplexing unit
52-1, 52-2, 52A-1, 52A-2, 52A-3 Bit addition unit
53, 53A-1, 53A-2 Upsampler
54, 54A Band synthesis filter
61 Orthogonal transformation unit
62-1, 62-2, 62-3 Grouping unit
63-1, 63-2, 63-3 Normalization unit
64-1, 64-2, 64-3 Quantization unit
72-1, 72-2, 72-3 Decoding unit
73-1, 73-2, 73-3 Dequantization unit
74-1, 74-2, 74-3 Denormalization unit
75-1, 75-2, 75-3 Ungrouping unit
76-1, 76-2, 76-3, 76D' Inverse orthogonal transformation unit

The invention claimed is:

1. A decoding device comprising:
circuitry configured to:
decode a different tactile signal encoded for each frequency band of a plurality of frequency bands; and
output the decoded tactile signal for each of the frequency bands.

2. The decoding device according to claim 1, wherein the encoded tactile signal includes a tactile signal on a basis of a detection signal of a tactile sensor.

3. The decoding device according to claim 1, wherein the encoded tactile signal includes a tactile signal encoded for each of the frequency bands according to properties of a receptor.

4. The decoding device according to claim 1, wherein the encoded tactile signal includes a tactile signal encoded for each of the frequency bands in a time domain after band-split.

5. The decoding device according to claim 4, wherein the encoded tactile signal is different, between at least a part of the frequency bands, in at least one of quantization bit length or a sampling frequency.

6. The decoding device according to claim 1, wherein the encoded tactile signal includes a tactile signal encoded for each of the frequency bands in a frequency domain after orthogonal transform.

7. The decoding device according to claim 6, wherein the encoded tactile signal includes a tactile signal encoded with a tactile signal component smaller than a predetermined amplitude threshold excluded from a target for quantization and encoding.

8. The decoding device according to claim 6, wherein the encoded tactile signal includes a tactile signal encoded by quantization with numbers of quantization steps different between at least a part of the frequency bands.

9. The decoding device according to claim 6, wherein the encoded tactile signal includes an entropy-encoded tactile signal.

10. The decoding device according to claim 1, wherein the circuitry is configured to individually output the decoded tactile signal for each of the frequency bands.

11. The decoding device according to claim 1, wherein the encoded tactile signal includes a plurality of tactile signals acquired by encoding frequency bands corresponding to a detection signal of a plurality of tactile sensors.

12. A decoding method comprising:
decoding a different tactile signal encoded for each frequency band of a plurality of frequency bands; and
outputting the decoded tactile signal for each of the frequency bands.

13. A non-transitory storage medium encoded with instructions that, when executed by a computer, execute processing comprising:
decoding a different tactile signal encoded for each frequency band of a plurality of frequency bands; and
outputting the decoded tactile signal for each of the frequency bands.

* * * * *